(12) United States Patent
Ukeda et al.

(10) Patent No.: US 9,018,704 B2
(45) Date of Patent: Apr. 28, 2015

(54) THIN-FILM TRANSISTOR AND METHOD OF MANUFACTURING THE SAME

(75) Inventors: Takaaki Ukeda, Osaka (JP); Akihito Miyamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/113,971

(22) PCT Filed: Oct. 20, 2011

(86) PCT No.: PCT/JP2011/005885
§ 371 (c)(1),
(2), (4) Date: Oct. 25, 2013

(87) PCT Pub. No.: WO2013/057766
PCT Pub. Date: Apr. 25, 2013

(65) Prior Publication Data
US 2014/0048883 A1     Feb. 20, 2014

(51) Int. Cl.
*H01L 27/32*     (2006.01)
*H01L 29/786*    (2006.01)
*H01L 51/05*     (2006.01)
*H01L 27/28*     (2006.01)
*H01L 29/66*     (2006.01)
*H01L 27/12*     (2006.01)
*H01L 51/00*     (2006.01)

(52) U.S. Cl.
CPC .......... *H01L 29/786* (2013.01); *H01L 51/0529* (2013.01); *H01L 27/283* (2013.01); *H01L 29/6675* (2013.01); *H01L 29/66772* (2013.01); *H01L 51/0078* (2013.01); *H01L 27/1255* (2013.01)

(58) Field of Classification Search
CPC .............. H01L 29/786; H01L 27/3244; H01L 27/3246; H01L 27/3265
USPC .................. 257/40, 59, 72, E29.117
See application file for complete search history.

(56) References Cited

U.S. PATENT DOCUMENTS 5,355,002 A  * 10/1994  Wu ................................. 257/57
5,946,551 A     8/1999   Dimitrakopoulos et al.
5,981,970 A    11/1999   Dimitrakopoulos et al.

(Continued)

FOREIGN PATENT DOCUMENTS

JP    10-270712     10/1998
JP    2001-244467    9/2001

(Continued)

OTHER PUBLICATIONS

International Search Report (ISR) in International Patent Application PCT/JP2011/005885, dated Nov. 29, 2011.

*Primary Examiner* — Tucker Wright
(74) *Attorney, Agent, or Firm* — Greenblum & Bernstein, P.L.C.

(57) ABSTRACT

The organic thin-film transistor according to the present invention includes: a gate electrode line on a substrate in a first region: a first signal line layer in a second region; a gate insulating film covering the gate electrode line and the first signal line layer; bank layers on the gate insulating film; a second signal line layer on the bank layer over the first signal line; a drain electrode and a source electrode line which are located on the bank layers and in at least one opening between the bank layers in the first region; a semiconductor layer located at least in the opening and banked up by the bank layers, the drain electrode, and the source electrode line; and a protection film covering the semiconductor layer.

11 Claims, 20 Drawing Sheets

(56) References Cited

U.S. PATENT DOCUMENTS

| | | |
|---|---|---|
| 6,210,479 B1 | 4/2001 | Bojarczuk et al. |
| 6,344,660 B1 | 2/2002 | Dimitrakopoulos et al. |
| 6,344,662 B1 | 2/2002 | Dimitrakopoulos et al. |
| 6,635,508 B2 | 10/2003 | Arai et al. |
| 7,015,502 B2 | 3/2006 | Arai et al. |
| 7,554,113 B2 | 6/2009 | Arai et al. |
| 7,738,048 B2 | 6/2010 | Yoshimoto |
| 7,816,158 B2 | 10/2010 | Yoshimoto |
| 8,168,983 B2 | 5/2012 | Yagi |
| 8,368,063 B2 | 2/2013 | Ukeda |
| 2002/0179901 A1 | 12/2002 | Arai et al. |
| 2004/0075093 A1 | 4/2004 | Arai et al. |
| 2006/0131573 A1 | 6/2006 | Arai et al. |
| 2007/0138469 A1 | 6/2007 | Yoshimoto |
| 2009/0213289 A1 | 8/2009 | Yoshimoto |
| 2010/0193779 A1* | 8/2010 | Lee .................................. 257/40 |
| 2010/0285632 A1* | 11/2010 | Inoue et al. ................... 438/104 |
| 2011/0012198 A1 | 1/2011 | Yagi |
| 2011/0062432 A1 | 3/2011 | Yamazaki et al. |
| 2011/0089543 A1 | 4/2011 | Ujita et al. |
| 2014/0014934 A1 | 1/2014 | Ukeda et al. |
| 2014/0021457 A1 | 1/2014 | Ukeda et al. |

FOREIGN PATENT DOCUMENTS

| | | |
|---|---|---|
| JP | 2002-111008 | 4/2002 |
| JP | 2002-359374 | 12/2002 |
| JP | 2005-227538 | 8/2005 |
| JP | 2007-171314 | 7/2007 |
| JP | 2008-153688 | 7/2008 |
| JP | 2009-021477 | 1/2009 |
| JP | 2010-034090 | 2/2010 |
| JP | 2010-079225 | 4/2010 |
| JP | 2011-086927 | 4/2011 |
| WO | 2008/065927 | 6/2008 |

* cited by examiner

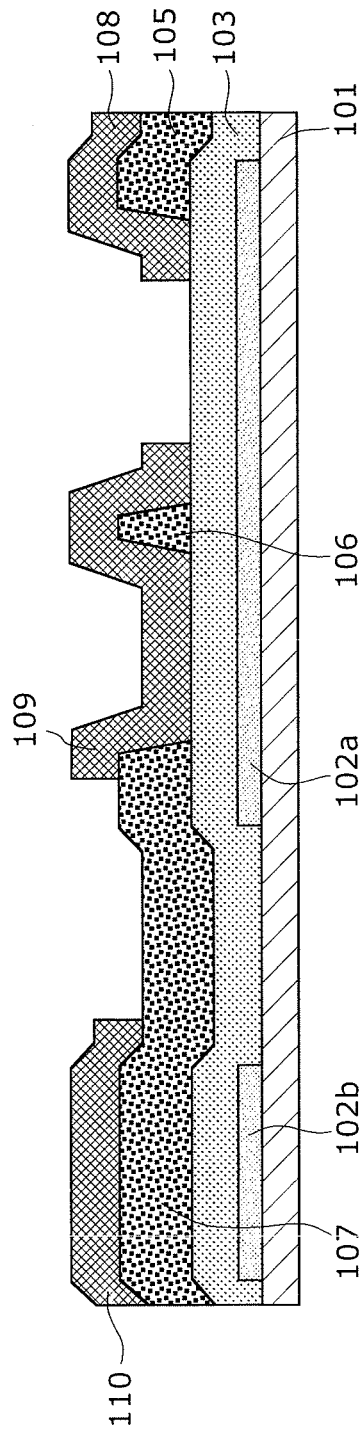
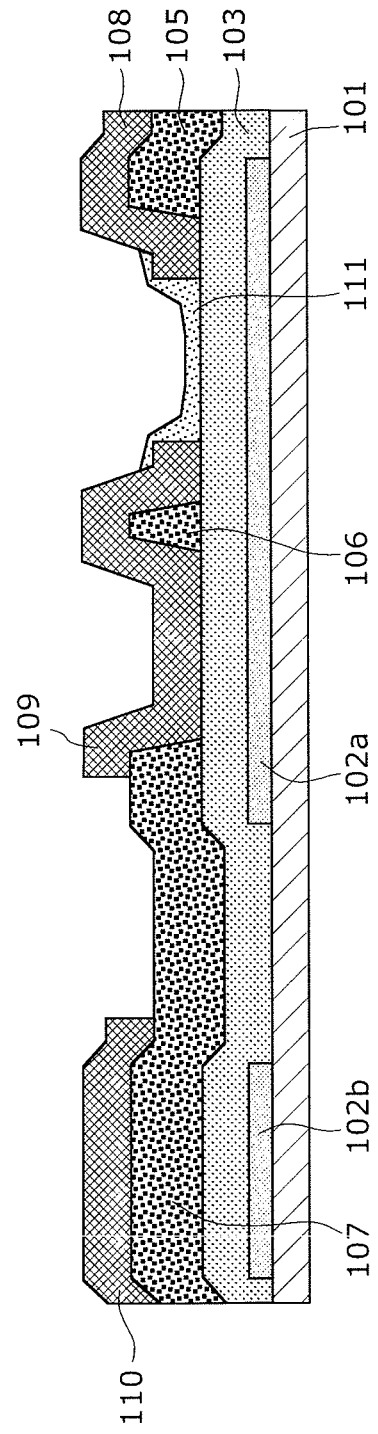

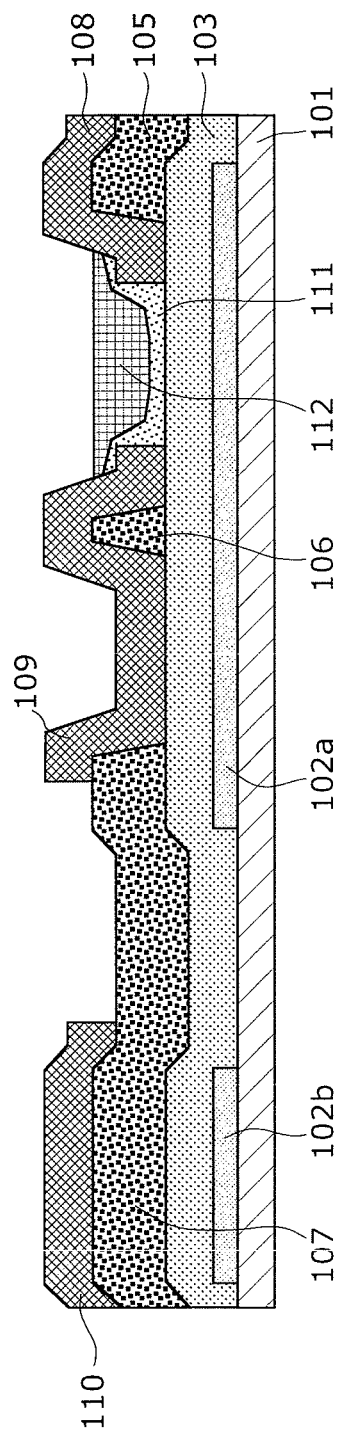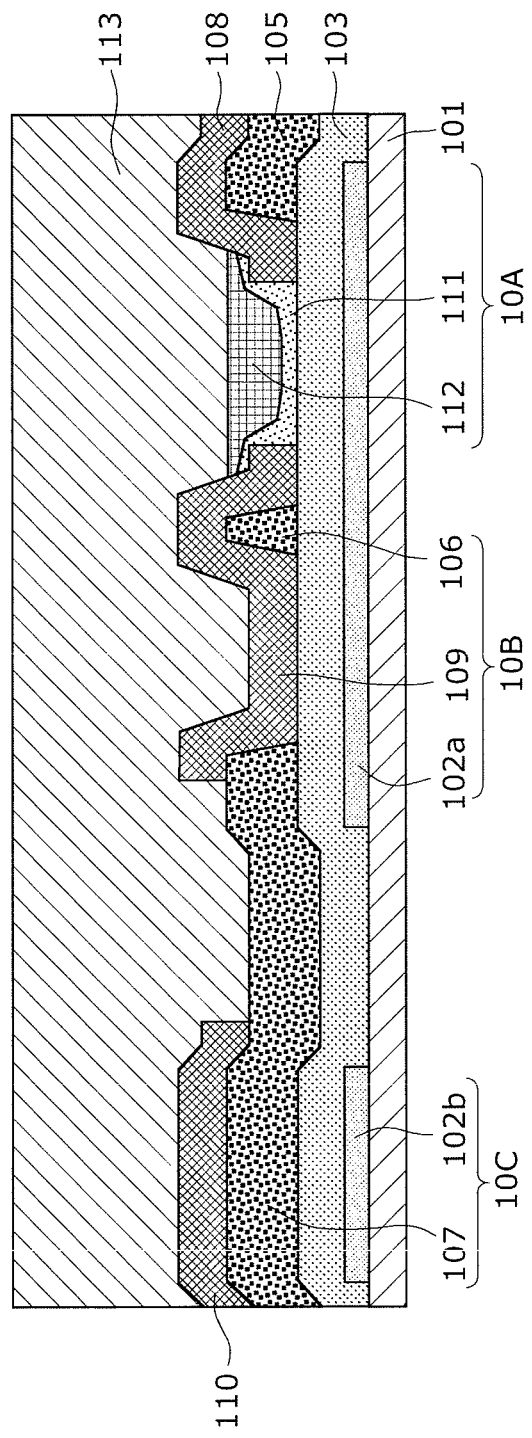

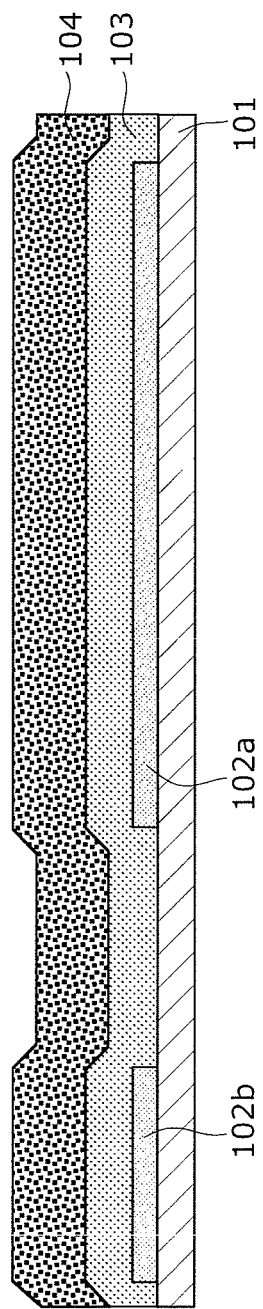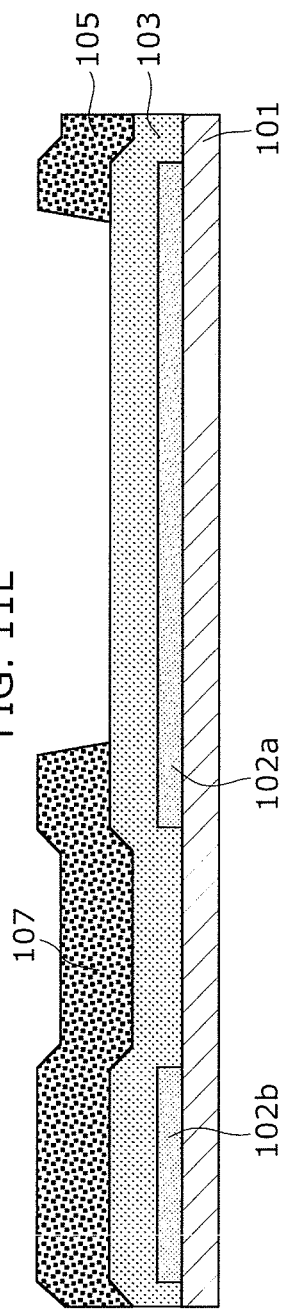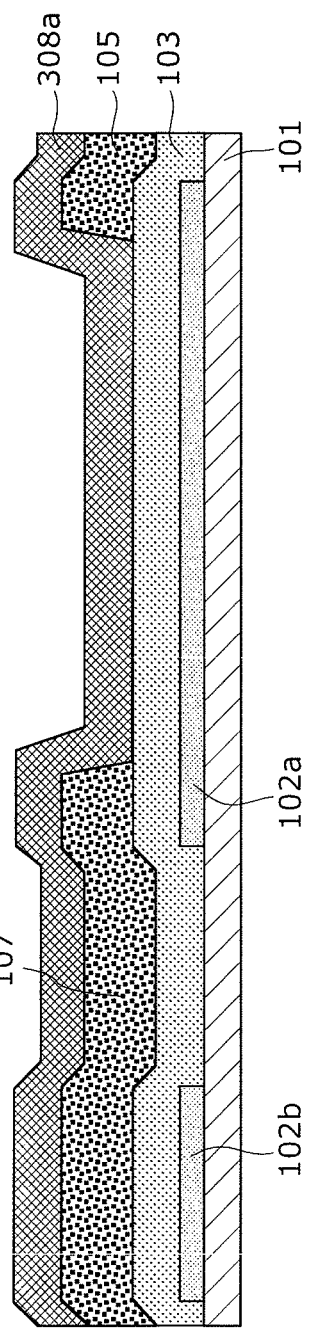

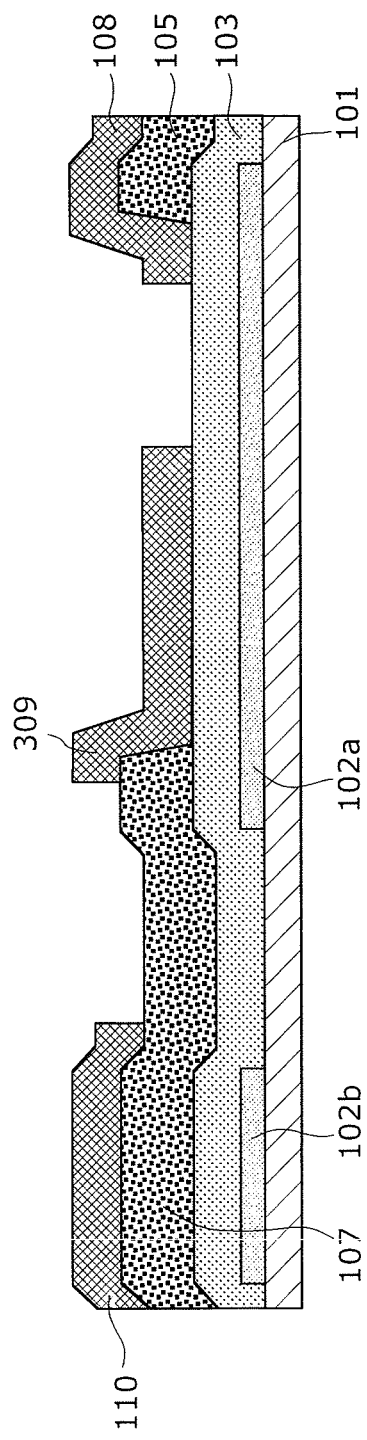
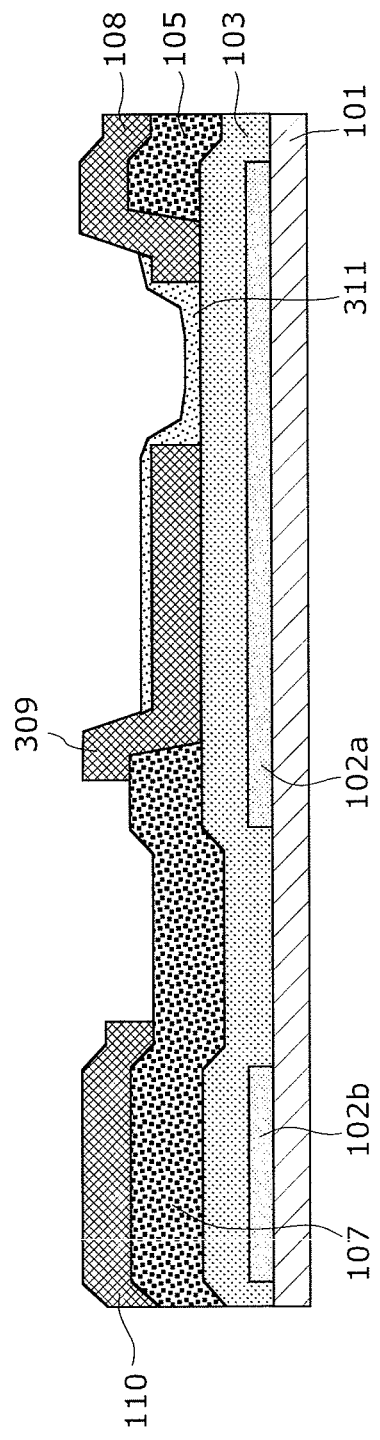

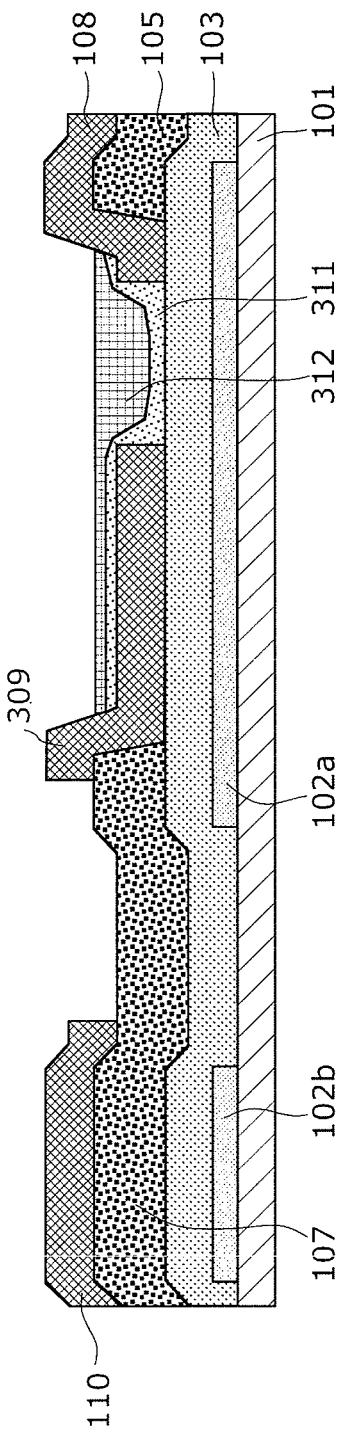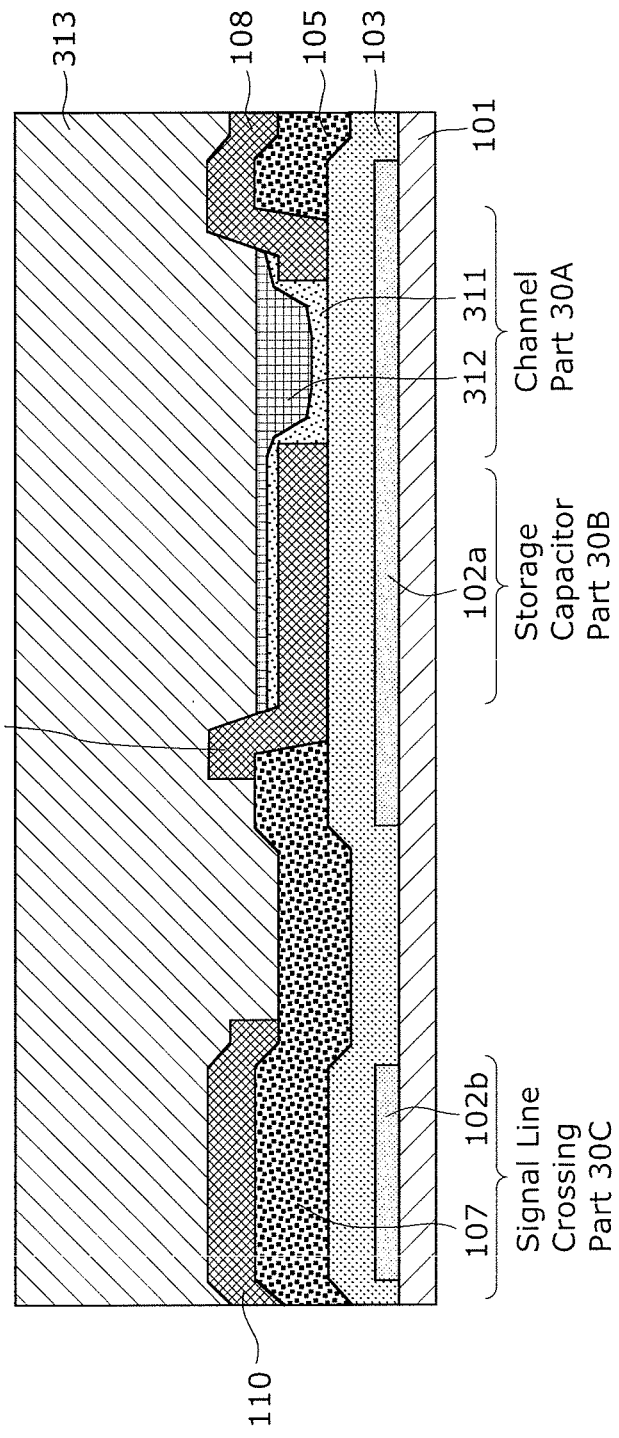

THIN-FILM TRANSISTOR AND METHOD OF MANUFACTURING THE SAME

TECHNICAL FIELD

The present invention relates to thin-film transistors and methods of manufacturing the same, and more particularly to a thin-film transistor having a bank layer and a method of manufacturing the same.

BACKGROUND ART

Active-matrix display devices, such as liquid crystal display devices and organic Electro Luminescence (EL) display devices, and the like employ Thin Film Transistors (TFT) in their pixel circuits.

An example of the thin-film transistors includes: a substrate; a gate electrode on the substrate; a gate insulating film over the gate electrode; a semiconductor layer on the gate insulating film; and a source electrode and a drain electrode which are electrically connected to the semiconductor layer.

Semiconductor layers in thin-film transistors are often made of silicon. However, in recent years, organic materials are used for semiconductor layers to provide organic thin-film transistors. For example, Patent Literature 1 (PLT-1) discloses such a conventional organic thin-film transistor.

Here, the description is given for an example of a TFT included in a pixel circuit of a display device. FIG. 12A is a top view of a conventional organic thin-film transistor 80. FIG. 12B is a cross-sectional view of the conventional organic thin-film transistor 80 taken along line A-A' of FIG. 11A.

As shown in FIG. 12B, the organic thin-film transistor 80 includes a substrate 801, a gate electrode line 802a, a first signal line layer 802b, a gate insulating film 803, a drain electrode 808, a source electrode line 809, a second signal line layer 810, bank layers 807 and 807, an organic semiconductor layer 811, a protection film 812, and a planarizing layer 813. In other words, the organic thin-film transistor 80 consists mainly of: a channel part 80A provided with a bottom-gate TFT; a storage capacitor part 80B; and a signal line crossing part 80C.

The channel part 80A is a bottom-gate TFT that includes the substrate 801, the gate electrode line 802a, the gate insulating film 803, the drain electrode 808, the source electrode line 809, the organic semiconductor layer 811 having circumference defined by the bank layers 807 and 807, and the protection film 812. The storage capacitor part 80B is a capacitor that includes the substrate 801, the gate electrode line 802a, the gate insulating film 803, and the source electrode line 809. The signal line crossing part 80C includes the first signal line layer 802b and the second signal line layer 810 which cross each other. There is the gate insulating film 803 between the first signal line layer 802ba and the second signal line layer 810.

CITATION LIST

Patent Literature

[PLT-1] Japanese Unexamined Patent Application No. 10-270712

SUMMARY OF INVENTION

Technical Problem

Recently, screen size increase and function improvement of display devices have been developed. The development requires improvement of TFT properties and reduction of parasitic capacitance. However, under the present circumstances, desired TFT properties are not obtained, and therefore quality of resulting displayed image is deteriorated.

In other words, generally, properties of the thin-film transistor in the channel part 80A depend on an electrostatic capacitance of the gate insulating film 803. In order to improve properties of a transistor, it is necessary to decrease a thickness of the gate insulating film 803 and to form the gate insulating film 803 using a material having a higher permittivity than that of an oxide film. However, if the gate insulating film 803 is thin, a gate leakage is increased (in other words, a withstand voltage is decreased) at an uneven part W1 of the gate electrode line 802a.

The same problem occurs also in the signal line crossing part 80C. In other words, if the gate insulating film 803 is thin, a gate leakage is increased (in other words, withstand voltage properties are decreased) at an uneven part W2 of the first signal line layer 802b.

Furthermore, since the gate insulating film 803 is thin in the signal line crossing part 80C, a parasitic capacitance is increased at a part where the first signal line layer 802b and the second signal line layer 810 cross each other, thereby preventing a high-speed operation of the pixel circuit.

As described above, if the gate insulating film 803 is thin, a gate leakage is increased (in other words, withstand voltage properties are decreased.) As result, desired properties of TFT are not obtained and therefore quality of resulting displayed image is deteriorated.

In order to solve the above-described conventional problems, an object of the present invention is to provide a thin-film transistor that has improved withstand voltage properties of a gate insulating film and a reduced parasitic capacitance at a part where signal lines cross each other, and a method of manufacturing the thin-film transistor.

Solution to Problem

In accordance with an aspect of the present invention for solving the problems, there is provided a thin-film transistor comprising: a gate electrode line on a substrate in a first region; a first signal line layer on the substrate in a second region that is different from the first region; a gate insulating film above the substrate, the gate insulating film covering the gate electrode line and the first signal line layer, and the gate insulating film being made of a first dielectric film; bank layers on the gate insulating film, the bank layers each being made of a second dielectric film having a lower permittivity than a permittivity of the first dielectric film; a second signal line layer on one of the bank layers over the first signal line; a pair of a drain electrode and a source electrode line which are located (a) on the bank layers and (b) in at least one opening between the bank layers in the second region; a semiconductor layer located at least on the gate insulating film in one of the at least one opening and banked up by two of the bank layers, the drain electrode, and the source electrode line; and a protection film covering the semiconductor layer and banked up by the two of the bank layers, the drain electrode, and the source electrode line.

Advantageous Effects of Invention

Thus, according to the present invention, it is possible to provide: a thin-film transistor that has improved withstand voltage properties of a gate insulating film and a reduced

BRIEF DESCRIPTION OF DRAWINGS

FIG. 5G is a cross-sectional view of one of the steps in the method of manufacturing the organic thin-film transistor according to Embodiment 1.

FIG. 5H is a cross-sectional view of one of the steps in the method of manufacturing the organic thin-film transistor according to Embodiment 1.

FIG. 5I is a cross-sectional view of one of the steps in the method of manufacturing the organic thin-film transistor according to Embodiment 1.

FIG. 5J is a cross-sectional view of one of the steps in the method of manufacturing the organic thin-film transistor according to Embodiment 1.

FIG. 11D is a cross-sectional view of one of the steps in the method of manufacturing the organic thin-film transistor according to Embodiment 2.

FIG. 11E is a cross-sectional view of one of the steps in the method of manufacturing the organic thin-film transistor according to Embodiment 2.

FIG. 11F is a cross-sectional view of one of the steps in the method of manufacturing the organic thin-film transistor according to Embodiment 2.

FIG. 11G is a cross-sectional view of one of the steps in the method of manufacturing the organic thin-film transistor according to Embodiment 2.

FIG. 11H is a cross-sectional view of one of the steps in the method of manufacturing the organic thin-film transistor according to Embodiment 2.

FIG. 11I is a cross-sectional view of one of the steps in the method of manufacturing the organic thin-film transistor according to Embodiment 2.

FIG. 11J is a cross-sectional view of one of the steps in the method of manufacturing the organic thin-film transistor according to Embodiment 2.

DESCRIPTION OF EMBODIMENTS

Figure 1:
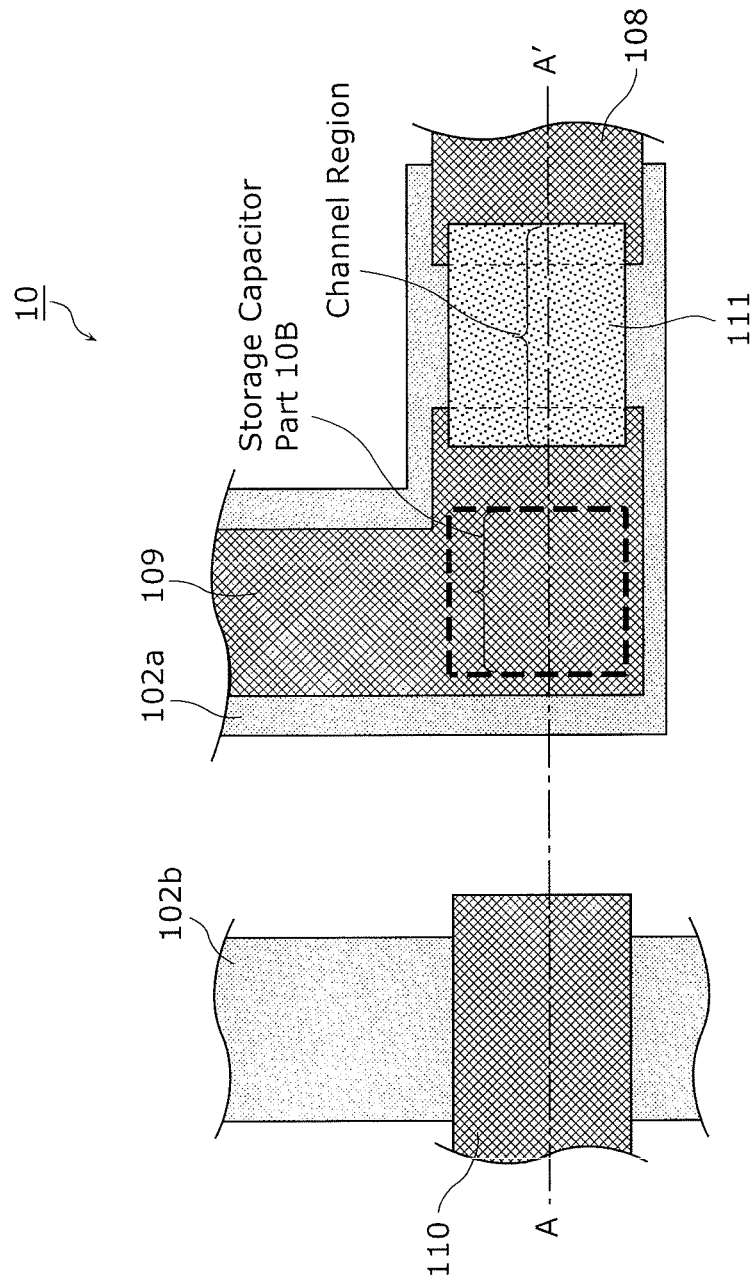
FIG. 1 is a top view of an organic thin-film transistor according to Embodiment 1.

In accordance with an aspect of the present invention, there is provided a thin-film transistor comprising: a gate electrode line on a substrate in a first region; a first signal line layer on the substrate in a second region that is different from the first region; a gate insulating film above the substrate, the gate insulating film covering the gate electrode line and the first signal line layer, and the gate insulating film being made of a first dielectric film; bank layers on the gate insulating film, the bank layers each being made of a second dielectric film having a lower permittivity than a permittivity of the first dielectric film; a second signal line layer on one of the bank layers over the first signal line; a pair of a drain electrode and a source electrode line which are located (a) on the bank layers and (b) in at least one opening between the bank layers in the second region; a semiconductor layer located at least on the gate insulating film in one of the at least one opening and banked up by two of the bank layers, the drain electrode, and the source electrode line; and a protection film covering the semiconductor layer and banked up by the two of the bank layers, the drain electrode, and the source electrode line It is thereby possible to provide a thin-film transistor that has improved withstand voltage properties of a gate insulating film and a reduced parasitic capacitance at a part where signal lines cross each other.

It is possible that the at least one opening is formed between two of the bank layers in a third region and a fourth region which are included in the second region to expose a part of the gate insulating film and, the source electrode line is located (a) on the gate insulating film in a first opening in the third region among the at least one opening, (b) on a first bank layer among the bank layers between the third region and the fourth region, and (c) on a part of the gate insulating film in a second opening in the fourth region among the at least one opening, the part of the gate insulating film being closer to the third region, the drain electrode is located (a) on another part of the gate insulating film in the second opening in the fourth region and (b) on a second bank layer in the fourth region among the bank layers, the another part of the gate insulating film and the second bank layer being farther from the third region, the semiconductor layer is located on the gate insulating film in the second opening in the fourth region and banked up by at least the drain electrode and the source electrode line, and the protection film covers the semiconductor layer and is banked up by at least the drain electrode and the source electrode line.

It is also possible that one of the at least one opening is formed between two of the bank layers in the second region to expose a part of the gate insulating film, the source electrode line is located (a) on an end of one of the two of the bank layers and (b) on a part of the gate insulating film in the one of the at least one opening, the end being closer to the one of the at least one opening, and the part of the gate insulating film being closer to the end, the drain electrode is located (a) on another part of the gate insulating film in the one of the at least one opening, and (b) on an other one of the two of the bank layers, the another part of the gate insulating film and the other one of the two of the bank layers being farther from the end, the semiconductor layer is located at least on the gate insulating film in the one of the at least one opening and banked up by the two of the bank layers, the drain electrode, and the source electrode line, and the protection film covers the semiconductor layer and is banked up by the two of the bank layers, the drain electrode, and the source electrode line.

It is further possible that the third region is a storage capacitor part that includes a part of the gate electrode line, a part of the gate insulating film, and at least a part of the source electrode, and the fourth region is a channel part that includes a part of the gate electrode line, a part of the gate insulating film, the semiconductor layer, a part of the drain electrode, and a part of the source electrode.

It is still further possible that the thin-film transistor has: a storage capacitor part that includes a part of the gate electrode line, a part of the gate insulating film, and at least a part of the source electrode; and a channel part that includes a part of the gate electrode line, a part of the gate insulating film, the semiconductor layer, a part of the drain electrode, and a part of the source electrode.

It is still further possible that the thin-film transistor further includes a planarizing layer covering the second signal line layer, the source electrode, the drain electrode, and the protection film.

It is still further possible that the drain electrode, the source electrode, and the second signal line layer are made of a same material.

It is still further possible that a side surface of the at least one opening has a forward tapered shape.

It is still further possible that the semiconductor comprises a coating organic semiconductor.

It is still further possible that the semiconductor comprises a coating oxide semiconductor.

In accordance with another aspect of the present invention, there is provided a method of manufacturing a thin-film transistor, comprising: forming (a) a gate electrode line on a substrate in a first region, and (b) a first signal line layer above the substrate in a second region that is different from the first region; forming a gate insulating film above the substrate, the gate insulating film covering the gate electrode line and the first signal line layer, and the gate insulating film being made of a first dielectric film; forming bank layers on the gate insulating film, the bank layers each being made of a second dielectric film having a lower permittivity than a permittivity of the first dielectric film; forming at least one opening between two of the bank layers in the second region; a second signal line layer on one of the bank layers over the first signal line; forming a drain electrode and a source electrode on the bank layers and in the at least one opening; forming a semiconductor layer at least on the gate insulating film in one of the at least one opening, the semiconductor layer being banked up by two of the bank layers, the drain electrode, and the source electrode; and forming a protection film to cover the semiconductor layer, the protection film being banked up by the two of the bank layers, the drain electrode, and the source electrode.

It is thereby possible to provide a method of manufacturing a thin-film transistor that has improved withstand voltage properties of a gate insulating film and a reduced parasitic capacitance at a part where signal lines cross each other.

In accordance with still another aspect of the present invention, there is provided a thin-film transistor, comprising: a gate electrode line layer on a substrate; a gate insulating film on the gate electrode line layer, the gate insulating film being made of a first dielectric film; bank layers on the gate insulating film, the bank layers each being made of a second dielectric film having a permittivity different from a permittivity of the first dielectric film; at least one opening between two of the bank layers in a region that includes a channel part and a storage capacitor part; a line layer on one of the bank layers in a region that is different from the channel part and the storage capacitor part; and a drain electrode and a source electrode line which are located on the gate insulating film in the at least one opening in the channel part and the storage capacitor part, wherein the channel part includes: a semiconductor layer located in the at least one opening; and a protection film covering the semiconductor layer, and the semiconductor layer has a circumference defined by the two of the bank layers, the drain electrode, and the source electrode line in the at least one opening in the channel part.

It is thereby possible to provide a thin-film transistor that has improved withstand voltage properties of a gate insulating film and a reduced parasitic capacitance at a part where signal lines cross each other.

Embodiment 1

The following describes embodiments of an organic thin-film transistor and a method of manufacturing the organic thin-film transistor according to the present invention. However, the present invention is characterized by the appended claims. Therefore, among constituent elements in the following embodiments, constituent elements that are not described in claims are described as elements constituting more desirable configurations, although such constituent elements are not necessarily required to achieve the object of the present invention. It should also be noted that the figures in the drawings are schematic diagrams and do not show the embodiments exactly.

Figure 2:
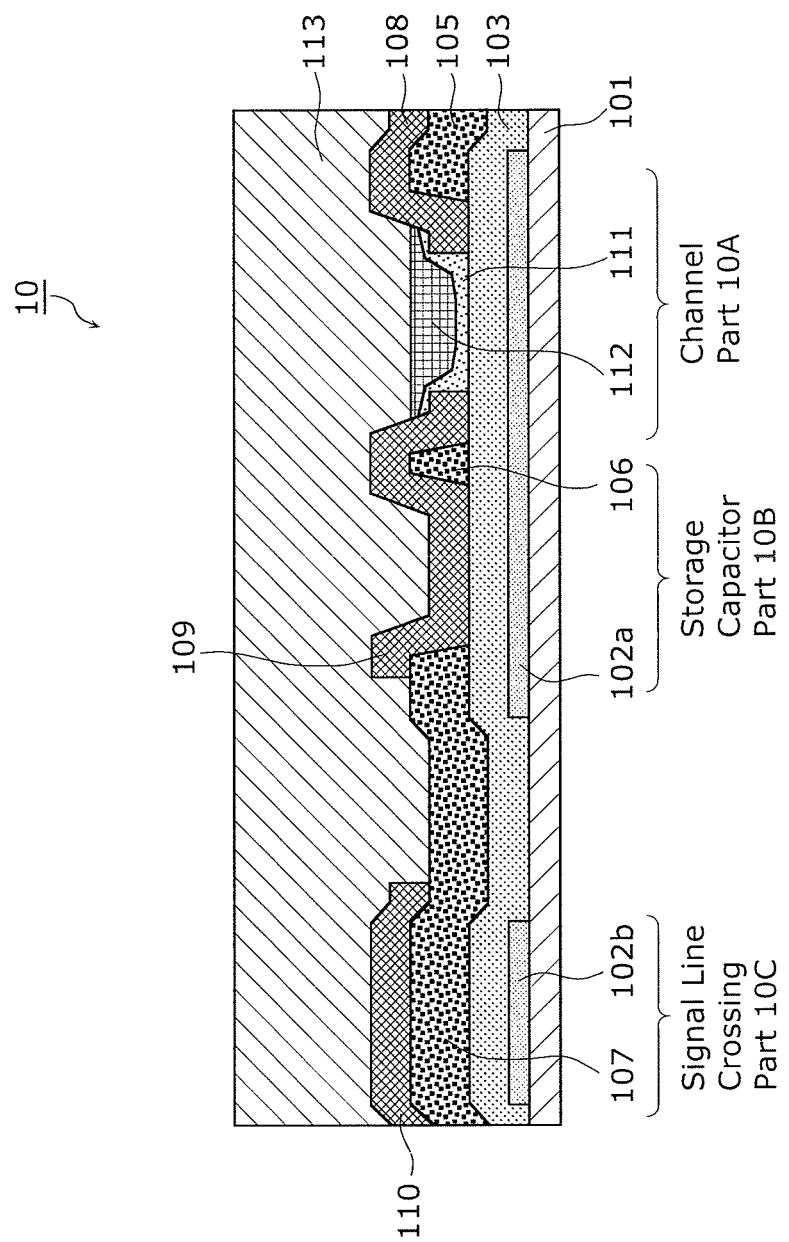
FIG. 2 is a cross-sectional view of an organic thin-film transistor taken along line A-A' of FIG. 1, according to Embodiment 1.

The following describes the organic thin-film transistor 10 according to Embodiment 1 with reference to FIGS. 1 and 2. FIG. 1 is a top view of the organic thin-film transistor 10 according to Embodiment 1. FIG. 2 is a cross-sectional view of the organic thin-film transistor 10 according to Embodiment 1 taken along line A-A' of FIG. 1.

As shown in FIG. 2, the organic thin-film transistor 10 includes a substrate 101, a gate electrode line 102a, a first signal line layer 102b, a gate insulating film 103, bank layers 105, 106, and 107, a drain electrode 108, a source electrode line 109, a second signal line layer 110, an organic semiconductor layer 111, a protection film 112, and a planarizing layer 113. In other words, the organic thin-film transistor 10 consists mainly of: a channel part 10A provided with a bottom-gate TFT; a storage capacitor part 10B; and a signal line crossing part 10C.

The channel part 10A is provided between the bank layer 105 and the bank layer 106. The channel part 10A has a bottom-gate TFT that includes the substrate 101, the gate electrode line 102a, the gate insulating film 103, the drain electrode 108, the source electrode line 109, the organic semiconductor layer 111, and the protection film 112. The storage capacitor part 10B is provided between the bank layer 106 and the bank layer 107. The storage capacitor part 10B has a capacitor that includes the substrate 101, the gate electrode line 102a, the gate insulating film 103 and the source electrode line 109. The signal line crossing part 10C includes the first signal line layer 102b and the second signal line layer 110 which cross each other. There are the gate insulating film 103 and the bank layer 107 between the first signal line layer 102ba and the second signal line layer 110.

The following describes each of the structural elements in more detail.

The substrate 101 is, for example, a glass substrate comprising a silica glass or an alkali-free glass. It should be noted that the substrate 101 may be a flexible substrate having a flexibility, such as a plastic film, or the like.

The gate electrode line 102a is provided on a predetermined region of the substrate 101, and the first signal line layer 102b is formed in the signal line crossing part that is a region different from the above predetermined region on the substrate 101. In the present embodiment, the gate electrode line 102a is patterned in a predetermined shape on the substrate 101 in the channel part 10A and the storage capacitor part 10B. Likewise, the first signal line layer 102b is patterned in a predetermined shape on the substrate 101 in the signal line crossing part 10C.

Each of the gate electrode line 102a and the first signal line layer 102b has a single-layer or multi-layer structure comprising conductive material(s) or its (theirs) alloy(s). For example, molybdenum (Mo), aluminium (Al), copper (Cu), tungsten (W), titanium (Ti), chromium (Cr), molybdenum tungsten (MoW), and the like are used.

The gate insulating film 103 is made of a first dielectric film that is formed on the substrate 101 to cover the gate electrode line 102a and the first signal line layer 102b. In the present embodiment, the gate insulating film 103 is formed over the whole substrate 101 to cover the gate electrode line 102a and the first signal line layer 102b.

Here, the first dielectric film may be an inorganic insulating film that is (a) a single-layer or multi-layer silicon nitride film, or (b) a multi-layer film including a silicon oxide film, a silicon nitride film, and/or the like. The first dielectric film may be an organic insulating film comprising polyimide, polyvinyl phenol, polypropylene, or the like.

The drain electrode 108 and the source electrode line 109 in a pair are formed in respective openings of the bank layers on the gate insulating film 103 (in other words, formed between the bank layer 105 and the bank layer 106, and between the bank layer 106 and the bank layer 107). The drain electrode 108 and the source electrode line 109 face each other with a predetermined interval above the gate electrode line 102a.

In other words, the source electrode line 109 is formed in the opening between the bank layers in the storage capacitor part 10B, on the bank layer between the storage capacitor part 10B and the channel part 10A, and in a part of the opening which is closer to the storage capacitor part 10B in the channel part 10A. The drain electrode 108 is provided in another part of the opening which is at an opposite side (farther from the storage capacitor part 10B) in the channel part 10A, and on the bank layer 105. More specifically, the source electrode line 109 is formed on: the gate insulating film 103 in a part of the opening closer to the storage capacitor part 10B in the channel part 10A; the bank layer 106; the gate insulating film 103 in the opening of the bank layer in the storage capacitor part 10B (in other words, the opening between the bank layer 106 and the bank layer 107); and one edge of the bank layer 107. The drain electrode 108 is formed on: a part of the opening of the bank layer on the gate insulating film 103 (a part of the opening between the bank layer 105 and the bank layer 106); and the bank layer 105.

Furthermore, each of the drain electrode 108 and the source electrode line 109 in a pair has a single-layer structure comprising a conductive material, its alloy, or the like. For example, Mo, W, Cu, Al, Au (gold), Ag (silver), MoW, MoN (molybdenum nitride), and/or the like.

In the present embodiment, the drain electrode 108 and the source electrode line 109 are provided on the bank layer 105 and the bank layer 106, so as to serve also as banks defining the circumference of the organic semiconductor layer 111. More specifically, each of the drain electrode 108 and the source electrode line 109 serves as a bank defining the circumference of the organic semiconductor layer 111. The drain electrode 108 and the source electrode line 109 together with the bank layers 105 and 106 block a flow of a solvent used as the organic semiconductor layer 111.

The bank layers (the bank layers 105, 106, and 107) are made of a second dielectric film on the gate insulating film 103. The second dielectric film has a lower permittivity than that of the first dielectric film. There are openings between the bank layers in the channel part 10A and the storage capacitor part 10B. Typically, a side surface of the opening of the bank layers in each of the channel part 10A and the storage capacitor part 10B has a forward tapered shape.

In the present embodiment, the bank layer 105 and the bank layer 106 are provided on the gate insulating film 103 to form an opening between them to separate the organic semiconductor layer 111 for each of pixels. The bank layer 107 is provided on the gate insulating film 103. The bank layers 105, 106, and 107 are made of the second dielectric film having a lower permittivity than that of the first dielectric film.

Here, the second dielectric film comprises a material having a lower permittivity than that of the first dielectric film. The second dielectric film may be an inorganic insulating film added with F. The inorganic insulating film is, for example, a single-layer or multi-layer film of silicon nitride film(s), or a multi-layer film including a silicon oxide film, a silicon nitride film, and/or the like. The second dielectric film may be an organic insulating film added with F. The organic insulating film comprises polyimide, polyvinyl phenol, polypropylene, or the like.

Furthermore, the second dielectric film may comprise a sensitive material such as a resist. More specifically, a bank layer comprising a sensitive material is formed, and the sensitive material is partially exposed to be developed to form an opening in the bank layer. As a result, the bank layers 105, 106, and 107 are obtained.

The second signal line layer 110 is provided above the first signal line layer 102b and on the bank layer 107. The second signal line layer 110 comprises the same material as that of the drain electrode 108 and the source electrode line 109. More specifically, the second signal line layer 110 has a single-layer structure comprising a conductive material, its alloy, or the like. For example, the second signal line layer 110 comprises Mo, W, Cu, Al, Au (gold), Ag (silver), MoW, MoN (molybdenum nitride), and/or the like.

The organic semiconductor layer 111 is provided on the gate insulating film 103 in the opening in the channel part 10A. Here, the organic semiconductor layer 111 is banked up by the bank layer 105, the bank layer 106, the drain electrode 108, and the source electrode line 109.

More specifically, the organic semiconductor layer 111 is provided between the drain electrode 108 and the source electrode line 109 in the opening of the bank layers (in other words, the opening between the bank layer 105 and the bank layer 106) in the channel part 10A.

More specifically, the organic semiconductor layer 111 is provided at least on the gate insulating film 103 between the drain electrode 108 and the source electrode line 109. The organic semiconductor layer 111 is surrounded by the side surfaces (in other words, the inner walls of the opening) of the drain electrode 108 and the source electrode line 109 in the opening formed by the bank layer 105 and the bank layer 106. The outer circumference of the organic semiconductor layer 111 is defined by the side surfaces (inner walls). In other words, the organic semiconductor layer 111 is continuously provided on: the side surface (inner wall) of the drain electrode 108 in the opening of the bank layers 105 and 106; the top surface of the exposed gate insulating film 103; the side surface (inner wall) of the source electrode line 109 in the opening of the bank layers 105 and 106; and the bank layers 105 and 106.

The organic semiconductor layer 111 is a coating organic semiconductor that comprises a coating organic material. By using a printing method such as an ink-jet method, the organic semiconductor layer 111 is formed by coating and crystallizing a predetermined solvent in a part between the drain electrode 108 and the source electrode line 109 in the opening of the bank layers. A material of the organic semiconductor layer 111 may be, for example, pentacene, phthalocyanine, or porphyrin soluble organic material. It should be noted that the material of the organic semiconductor layer 111 is not limited to an organic material, but may be a coatable inorganic material. In other words, for example, the organic semiconductor layer 111 may comprise a coating oxide semiconductor.

The protection film 112 is provided to cover the organic semiconductor layer 111. Here, the protection film 112 is banked up by the bank layer 105, the bank layer 106, the drain electrode 108, and the source electrode line 109. More specifically, the protection film 112 is provided on the organic semiconductor layer 111 to protect the organic semiconductor layer 111. In the present embodiment, between the drain electrode 108 and the source electrode line 109 in the opening of the bank layers, the protection film 112 is formed to cover the organic semiconductor layer 111. The outer circumference of the protection film 112 is defined by the side surfaces (inner walls) of the drain electrode 108 and the source electrode line 109 in the opening formed by the bank layer 105 and the bank layer 106.

Here, the protection film 112 desirably includes a cross-linked material caused by light. For the cross-linked material caused by light, light irradiation causes molecular bonds among molecules, and the molecular structure is densified to fortify the polymer bonds. It is thereby possible to effectively prevent water, oxygen, or impurity from entering the organic semiconductor layer 111. Examples of the cross-linked material caused by light are a high molecular material such as acrylic polymer, and a low molecular material such as acrylic monomer. Furthermore, the protection film 112 desirably includes a cross-linked material caused by heat in addition to a cross-linked material caused by light. It should be noted that the material of the protection film 112 is not limited to an organic material, but may be a material generated by adding an inorganic material such as silicon to the above-described organic materials. If such a material generated by adding an inorganic material such as silicon to an organic material is used, it is possible to further prevent water, oxygen, or the like from entering the organic semiconductor layer 111, in comparison to the organic protection film made only of an organic material.

The planarizing layer 113 covers the second signal line layer 110, the source electrode line 109, the drain electrode 108, and the protection film 112 to smooth the organic thin-film transistor 10. In the present embodiment, the planarizing layer 113 is provided on the drain electrode 108 and the source electrode line 109 to cover fill the protection film 112 to fill the opening of the bank layers. Furthermore, the planarizing layer 113 fills an exposed part of the bank layer 107 between the storage capacitor part 10B and the signal line crossing part 10C. As described above, the planarizing layer 113 suppresses occurrence of a leak current between layers, and smoothes the surface of the organic thin-film transistor 10. The planarizing layer 113 may comprise, for example, an organic material such as a resist, or an inorganic material such as Spin On Glass (SOG).

In other words, the provision of the planarizing layer 113 causes the protection film 112 to prevent property deterioration of the organic semiconductor layer 111, and causes the planarizing layer 113 to serve as an interlayer insulating layer. Therefore, the protection film 112 and the planarizing layer 113 can offer the different functions. It is therefore possible to prevent property deterioration of the organic semiconductor layer 111 and prevent a current leakage between layers. As a result, the organic thin-film transistor 10 has a high reliability.

Thus, the organic thin-film transistor 10 has the above-described structure.

Figure 3:
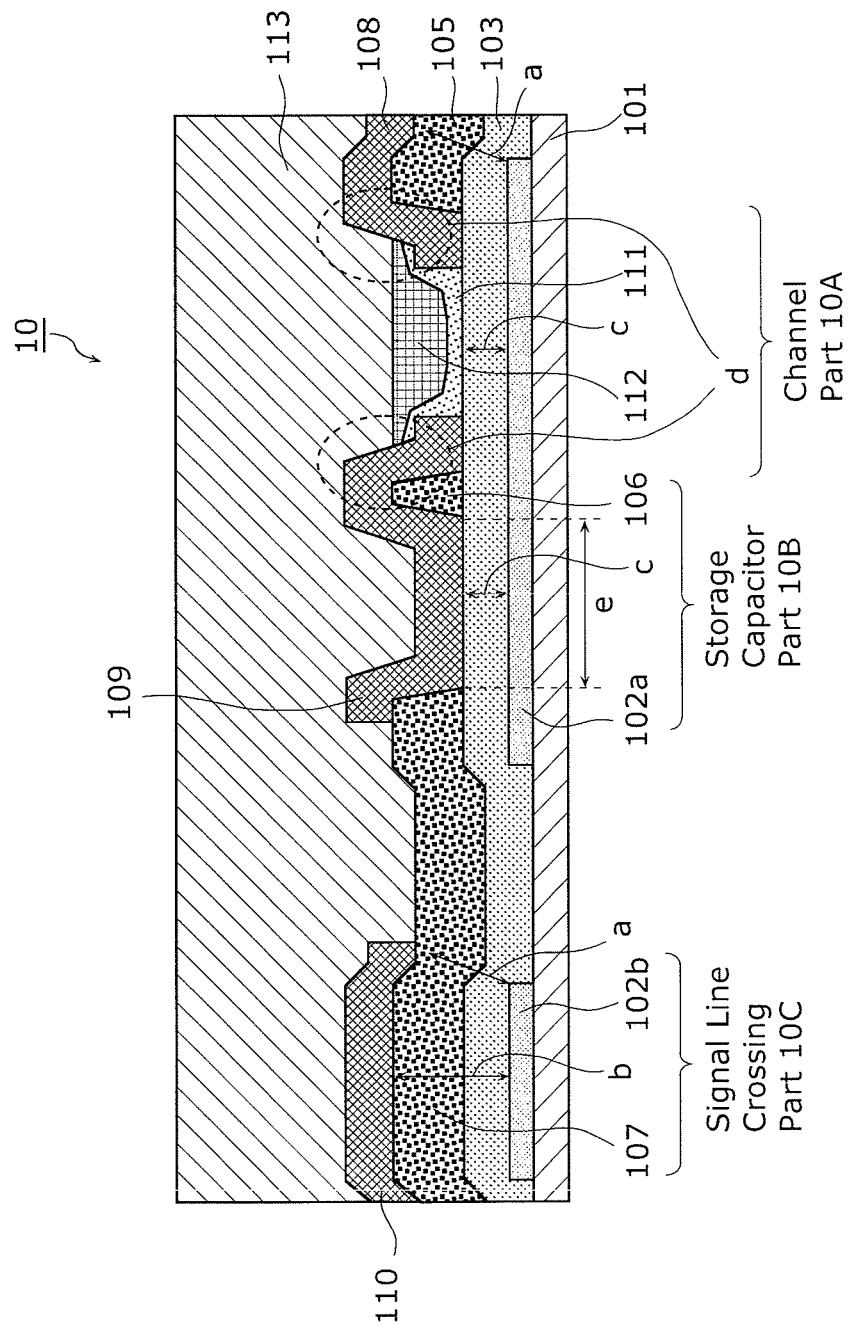
FIG. 3 is a view for explaining effects of the organic thin-film transistor according to Embodiment 1.

Next, the description is given for the effects of the organic thin-film transistor 10 according to Embodiment 1. FIG. 3 is a view for explaining the effects of the organic thin-film transistor 10 according to Embodiment 1. The identical reference numerals in FIG. 2 are assigned to the identical elements that are not explained again below.

For the organic thin-film transistor 10, the bank layers 105, 106, and 107 are formed on the gate insulating film 103. After that, the drain electrode 108, the source electrode line 109, and the second signal line layer 110 are formed. As a result, as shown in regions d each surrounded by a broken line in FIG. 3, the thickness of the bank layer 105 causes an unevenness of the drain electrode 108, and the thickness of the bank layer 106 causes an unevenness of the source electrode line 109. Thereby, the drain electrode 108 and the source electrode line 109 as well as the bank layers 105 and 106 serve as banks for the organic semiconductor layer 111.

With the above structure, the organic thin-film transistor 10 can produce four effects described below. The four effects are as follows.

At the beginning, the first effect is explained.

Regarding the organic thin-film transistor 10, in the channel part 10A, there is the bank layer 105 between the drain electrode 108 and the gate insulating film 103. With this structure, the bank layer 105 can cover a part of the gate insulating film 103 which is on the end of the gate electrode line 102a having a low withstand voltage property (low insulating withstand voltage). Furthermore, the bank layer 105 can keep an enough distance a between the gate electrode line 102a and the drain electrode 108. As a result, a leak current can be prevented. In other words, it is possible to improve the withstand voltage property. Likewise, in the signal line crossing part 10C, there is the bank layer 107 between the second signal line layer 110 and the gate insulating film 103. With this structure, the bank layer 107 can cover a part of the gate insulating film 103 which is on the end of the first signal line layer 102b having a low withstand voltage property (low insulating withstand voltage). Furthermore, the bank layer 107 can keep an enough distance a between the first signal line layer 102b and the second signal line layer 110. As a result, a leak current can be prevented. In other words, it is possible to improve the withstand voltage property.

Next, the second effect is explained.

Regarding the organic thin-film transistor 10, in the signal line crossing part 10C, there is the bank layer 107 between the second signal line layer 110 and the gate insulating film 103. With this structure, it is possible to increase a thickness of a layer between the second signal line layer 110 and the first signal line layer 102b. As a result, a parasitic capacitance is suppressed.

Next, the third effect is explained.

Regarding the organic thin-film transistor 10, in the channel part 10A, the organic semiconductor layer 111 is provided directly on the gate insulating film 103 without providing a bank layer between the organic semiconductor layer 111 and the gate insulating film 103. Also in the storage capacitor part 10B, the source electrode line 109 is provided directly on the gate insulating film 103 without providing a bank layer between the source electrode line 109 and the gate insulating film 103. As a result, the gate insulating film 103 is thin in each of the channel part 10A and the storage capacitor part 10B. In other words, it is possible to ensure electrostatic capacitance of the gate insulating film 103 which is necessary to improve property of the organic thin-film transistor 10.

Finally, the fourth effect is explained.

In the organic thin-film transistor 10, the bank layers 105, 106, and 107 are made of the second dielectric film having a lower permittivity than that of the first dielectric film serving as the gate insulating film 103. With this structure, in the signal line crossing part 10C, it is possible to enhance the second effect of suppressing the parasitic capacitance. Furthermore, in the channel part 10A, it is possible to enhance the third effect of ensuring the electrostatic capacitance of the gate insulating film 103.

In other words, it is possible to decrease the thickness of the gate insulating film 103 in each of the channel part 10A and the storage capacitor part 10B, and increase a thickness of an insulating film in the signal line crossing part 10C by providing a bank layer that is an insulating film (for example, the second permittivity film) different from the gate insulating film 103.

As a result, it is possible not only to improve the property by decreasing the thickness of the gate insulating film 103 in the channel part 10A, but also to increase a storage capacity in the storage capacitor part 10B, and to reduce a signal delay (to increase an operation speed of a pixel circuit) in the signal line crossing part 10C by increasing the thickness of the insulating film and decreasing a permittivity.

In general, the property of the thin-film transistor in the channel part 10A is defined as $Ids=W/(2*L)*\mu*Cox*Vds^2$. Here, Ids represents a current flowing from a drain to a source. $\mu$ represents a shift degree of a carrier, and Cox represents a capacity of the gate insulating film per unit area. W represents a channel width, and L represents a channel length. Vds represents a voltage between a drain electrode and a source electrode. As defined above, Ids is increased in proportion to a capacity of the gate insulating film, and in proportion to W/L. Therefore, the organic thin-film transistor 10 having the above structure can increase the storage capacity, so that even a transistor having a shorter W can obtain the same Ids as that in the conventional technique. In addition, the storage capacitor part 10B having a smaller area can obtain the same the storage capacity as that in the conventional technique. This means that it is possible to provide, in the storage capacitor part 10B, an organic thin-film transistor that has performance equal to the conventional performance and a smaller area than the conventional area. In other words, the organic thin-film transistor can be miniaturized.

Figure 4:
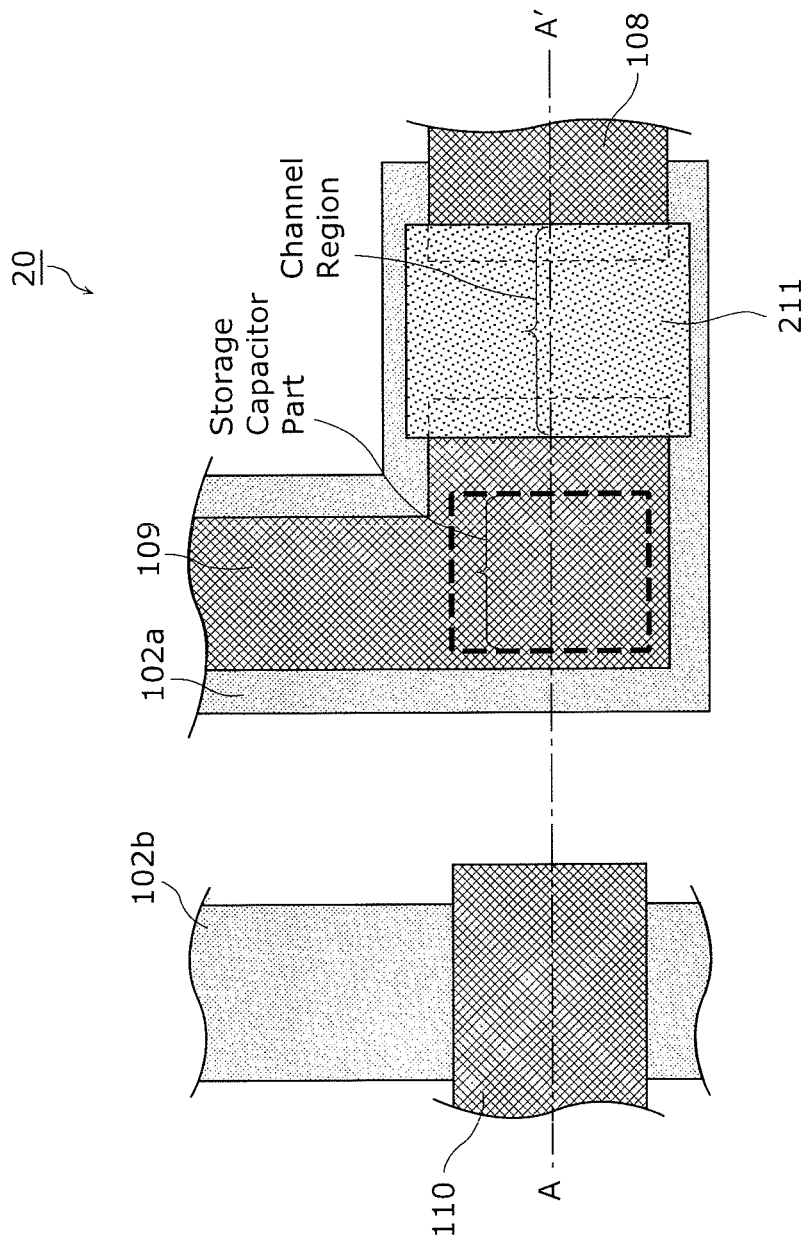
FIG. 4 is a top view of an organic thin-film transistor according to a variation of Embodiment 1.

It should be noted that it has been described above that, as shown in FIG. 1, in viewing the organic semiconductor layer 111 from above, the width of the channel region that is a region of the organic semiconductor layer 111 is shorter than the width of each of the drain electrode 108 and the source electrode line 109. However, the structure is not limited to the above. For example, as shown in FIG. 4, it is also possible that the width of the channel region is longer than the width of each of the drain electrode 108 and the source electrode line 109 viewed from above. Here, FIG. 4 is a top view of an organic thin-film transistor 20 according to a variation of Embodiment 1.

Next, a method of manufacturing the organic thin-film transistor 10 according to Embodiment 1 is described with reference to FIGS. 5A to 5J. FIGS. 5A to 5J are cross-sectional views for explaining respective steps in the method of manufacturing the organic thin-film transistor 10 according to Embodiment 1.

Figure 5A:
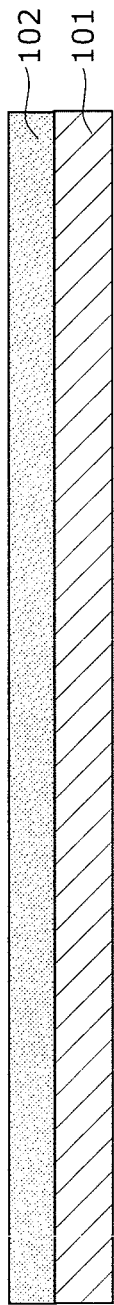
FIG. 5A is a cross-sectional view of one of steps in a method of manufacturing the organic thin-film transistor according to Embodiment 1.

First, as shown in FIG. 5A, a material of the gate electrode line 102a and the first signal line layer 102b is deposited on the substrate 101 to form a metal layer 102. In the present embodiment, a glass substrate is used as the substrate 101. The material of the metal layer 102 may be Mo, Al, Cu, W, Ti, Cr, MoW, or the like. The metal layer 102 can be formed by spattering or vapor deposition.

Figure 5B:
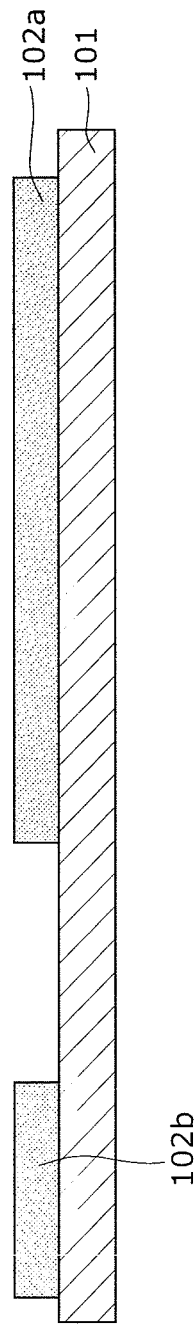
FIG. 5B is a cross-sectional view of one of the steps in the method of manufacturing the organic thin-film transistor according to Embodiment 1.

Next, shown in FIG. 5B, photolithography and etching are performed to pattern the metal layer 102 to form the gate electrode line 102a and the first signal line layer 102b. As a result, the gate electrode line 102a and the first signal line layer 102b have different predetermined shapes on different regions on the substrate 101. It should be noted that the etching for the metal layer 102 may be wet etching or dry etching.

Figure 5C:
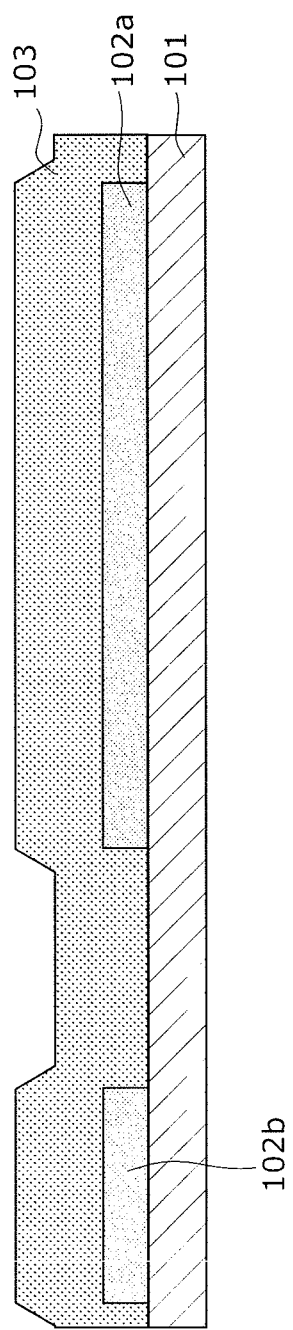
FIG. 5C is a cross-sectional view of one of the steps in the method of manufacturing the organic thin-film transistor according to Embodiment 1.

Next, as shown in FIG. 5C, the gate insulating film 103 is formed on the substrate 101, covering the gate electrode line 102a and the first signal line layer 102b. The gate insulating film 103 is formed over the whole the substrate 101 to cover the gate electrode line 102a and the first signal line layer 102b, by using plasma CVD or a coating method depending on the material of the gate insulating film 103. For example, the gate insulating film 103 is made of the first dielectric film comprising a material having a predetermined permittivity. For example, the gate insulating film 103 may be formed by plasma CVD as the first dielectric film that is (a) a single-layer or multi-layer silicon nitride film, or (b) a multi-layer film including a silicon oxide film, a silicon nitride film, and/or the like. It should be noted that the gate insulating film 103 may be formed by a coating method as the first dielectric film that is an organic insulating film comprising polyimide, polyvinyl phenol, polypropylene, or the like.

Figure 5D:
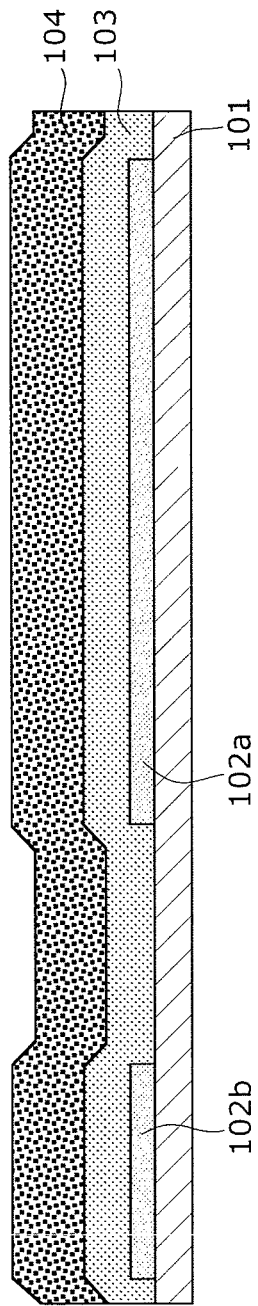
FIG. 5D is a cross-sectional view of one of the steps in the method of manufacturing the organic thin-film transistor according to Embodiment 1.

Next, as shown in FIG. 5D, on the gate insulating film 103, a bank layer 104 made of the second dielectric film having a lower permittivity than that of the first dielectric film is formed. The bank layer 104 can be formed by plasma CVD or a coating method depending on the material of the bank layer 104. For example, the bank layer 104 is formed as the second dielectric film having a lower permittivity than that of the first dielectric film. For example, the bank layer 104 may be formed by plasma CVD as the second dielectric film that is a silicon oxide film added with F. It should be noted that the bank layer 104 may be formed by a coating method as the second dielectric film that is an organic insulating film comprising polyimide, polyvinyl phenol, polypropylene, or the like added with F.

Figure 5E:
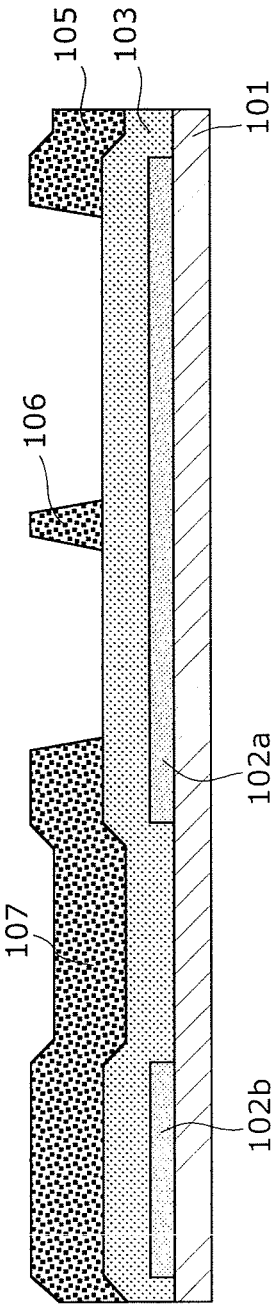
FIG. 5E is a cross-sectional view of one of the steps in the method of manufacturing the organic thin-film transistor according to Embodiment 1.

Next, as shown in FIG. 5E, the bank layer 104 is patterned to expose the gate insulating film 103, so as to form openings at predetermined regions, which will be the channel part 10A and the storage capacitor part 10B, over the gate electrode line 102*a*. As a result, the bank layers 105, 106, and 107 having respective different predetermined shapes are formed.

Here, the bank layers 105, 106, and 107 are formed by patterning the bank layer 104 by photolithography and etching. The predetermined regions of the bank layer 104 are removed by etching to expose the gate insulating film 103.1*t* should be noted that the etching on the bank layer 104 may be wet etching or dry etching. It should also be noted that, if the bank layer 104 is made of the second dielectric film that is an organic insulating film added with F, the patterning may be performed by exposure and development on the bank layer 104.

Figure 5F:
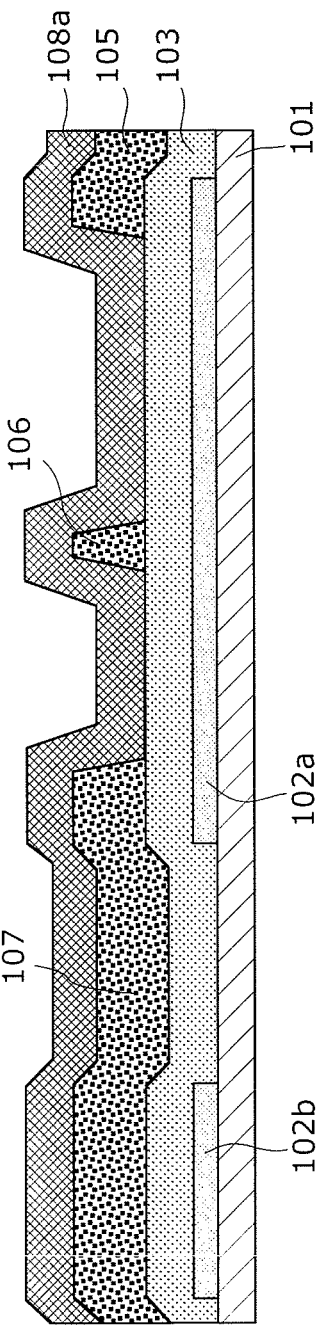
FIG. 5F is a cross-sectional view of one of the steps in the method of manufacturing the organic thin-film transistor according to Embodiment 1.

Next, as shown in FIG. 5F, a material of the drain electrode 108, the source electrode line 109, and the second signal line layer 110 is deposited on the bank layers 105, 106, and 107, and the gate insulating film 103, thereby forming a metal layer 108*a*. The metal layer 108*a* is formed as a single-layer film comprising Mo, W, Cu, Al, Au, Ag, MoW, MoN, or the like by spattering or vapor deposition. In the present embodiment, a single-layer film comprising MoW is formed as the metal layer 108*a*.

Next, as shown in FIG. 5G, the metal layer 108*a* is patterned by photolithography and etching so as to form the drain electrode 108, the source electrode line 109, and the second signal line layer 110 which have respective different predetermined shapes. The removal by the etching exposes a predetermined region, which will be the channel part 10A, of the gate insulating film 103. It should be noted that the etching on the metal layer 108*a* may be wet etching or dry etching.

It is thereby possible to form the second signal line layer on the bank layer 107 above the first signal line layer 102*b*. It is also possible to form the source electrode line 109 (*a*) in the opening between the bank layer 107 and the bank layer 106, (b) on the bank layer 106, and (c) in a part of the opening between the bank layer 106 and the bank layer 105. It is further possible to form the drain electrode 108 (*a*) in a part closer to the bank layer 105 in the opening between the bank layer 106 and the bank layer 105 and (b) and on the bank layer 105.

In the present embodiment, when the metal layer 108*a* is patterned, the second signal line layer 110 of the organic thin-film transistor 10 as well as the drain electrode 108 and the source electrode line 109 are formed at the same time by the patterning. In other words, the second signal line layer 110 in the signal line crossing part 10C of the organic thin-film transistor 10 is formed together with the drain electrode 108 and the source electrode line 109 at the same time to comprise the same material.

For example, it is possible to form a plurality of signal lines including the second signal line layer 110 by patterning the metal layer 108*a*. It is also possible to form the drain electrode 108 as one of the signal lines.

Next, as shown in FIG. 5H, a solution (organic semiconductor solution) including an organic semiconductor material is coated by an ink-jet method on the gate insulating film 103 between the drain electrode 108 and the source electrode line 109 in the opening between the bank layer 106 and the bank layer 105. Here, the coating solution including the organic semiconductor material is spread on the exposed top surface of the gate insulating film 103, and also spread on the side surfaces and the top surfaces of the uneven parts of the drain electrode 108 and the source electrode line 109 in the opening between the bank layer 106 and the bank layer 105. Furthermore, the coating region of the solution including the organic semiconductor material is defined by effects of the unevenness of the bank layer 105 and the bank layer 106. It is thereby possible to prevent that the solution including the organic semiconductor material from leaking to the outside of the opening between the bank layer 106 and the bank layer 105.

After that, a predetermined heat treatment is performed to dry the solution including the organic semiconductor material to crystallize the organic semiconductor material. Thereby, it is possible to form the organic semiconductor layer 111 having outer circumference defined by the drain electrode 108 and the source electrode line 109 in the opening between the bank layer 106 and the bank layer 105. Here, the drain electrode 108 is formed on the bank layer 105 and the source electrode line 109 is formed on the bank layer 106.

It should be noted that, in coating the organic semiconductor material solution by the ink-jet method, it is preferable to put drops of the solution onto the center area of the opening between the bank layer 106 and the bank layer 105. With this structure, the solution including the organic semiconductor material is homogeneously spread in the region surrounded by the drain electrode 108 and the source electrode line 109 in the opening between the bank layer 106 and the bank layer 105. As a result, it is possible to form the organic semiconductor layer 111 having more uniform thickness throughout. The organic semiconductor material may be pentacene, phthalocyanine, or porphyrin soluble organic material. It should be noted that the above-described predetermined heat treatment is preferably performed at a temperature allowing the organic semiconductor material in the solution to be crystallized without being decomposed by the heat, and allowing the solvent of the solution to evaporate. In the present embodiment, the heat treatment is performed at approximately 200° C.

Next, as shown in FIG. 5I, a solution including an overcoat material, which is a material of the protection film 112, is applied by an ink-jet method onto the organic semiconductor layer 111 to coat the region surrounded by the drain electrode 108 and the source electrode line 109 in the opening between the bank layer 106 and the bank layer 105. Here, the coating region of the solution including the overcoat material is defined by the effects of the unevenness of each of the bank layer 105 and the bank layer 106. As a result, it is possible to prevent the solution including the overcoat material from leaking to the outside of the opening between the bank layer 106 and the bank layer 105. After coating the predetermined region by the solution including the overcoat material, a predetermined heat treatment is performed. Thereby, the solution including the overcoat material is dried to form the protection film 112 with defined outer circumference.

Here, if the overcoat material in the solution includes a cross-linked material caused by heat, the heat treatment can improve the protection function of the protection film 112. Furthermore, if the overcoat material includes a cross-linked material caused by light, irradiation of light such as ultra violet rays causes molecular bonds among molecules of the overcoat material, and the molecular structure is densified to fortify the polymer bonds. It is thereby possible to enhance the effects of the protection film 112 to block oxygen, water, or impurity.

It should be noted that it has been described in the present embodiment that the overcoat material is applied by the ink-jet method, but it is also possible to apply the overcoat material to the entire surface by spin coating to produce the same effects as long as a necessary thickness is obtained on the organic semiconductor.

Next, as shown in FIG. 5J, the planarizing layer 113 is formed to cover the second signal line layer 110, the source electrode line 109, the drain electrode 108, and the protection film 112. The planarizing layer 113 has a desired thickness to have a planar surface. It should be noted that the planarizing layer 113 may be formed by coating a predetermined material such as SOG.

As described above, the organic thin-film transistor 10 according to the present embodiment can be manufactured.

Here, in order to compare with the present embodiment, a method of manufacturing the conventional organic thin-film transistor 80 is described with reference to FIGS. 6A to 6D. FIGS. 6A to 6D are cross-sectional views for explaining steps in the method of manufacturing the conventional organic thin-film transistor 80.

Figure 6A:
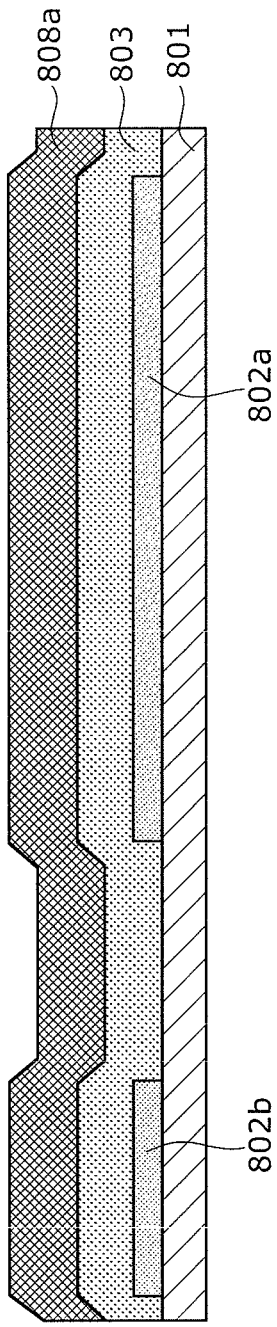
FIG. 6A is a cross-sectional view of one of steps in a method of manufacturing a conventional organic thin-film transistor.

The steps prior to FIG. 6A are the same as FIGS. 5A to 5C, so that the steps are not described again below.

As shown in FIG. 6A, the drain electrode 808, the source electrode line 809, and the second signal line layer 810 are deposited on the entire surface of the gate insulating film 803 to form a metal layer 808a. The metal layer 808a is formed by spattering or vapor deposition as a single-layer or multi-layer film or a metal alloy film comprising Mo, W, Cu, Al, Au, Ag, MoW, MoN, and/or the like. In the present embodiment, a single-layer film comprising MoW is formed as the metal layer 808a.

Figure 6B:
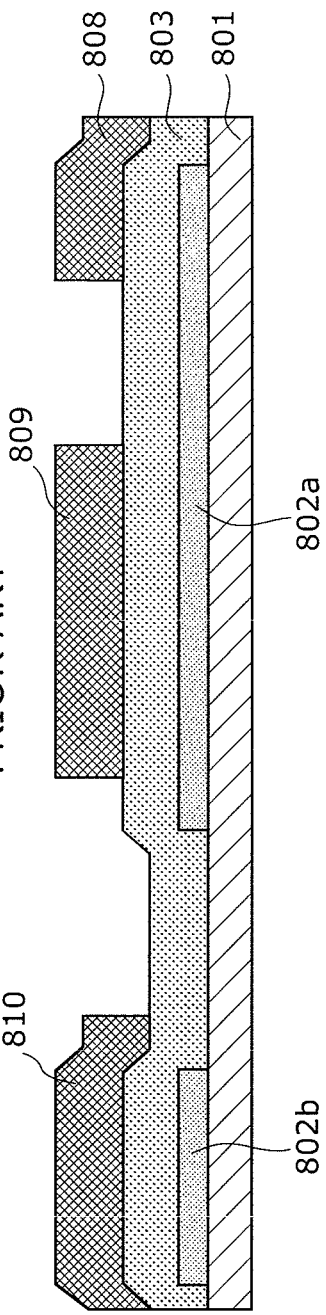
FIG. 6B is a cross-sectional view of one of the steps in the method of manufacturing the conventional organic thin-film transistor.

Next, as shown in FIG. 6B, the metal layer 808a is patterned by photolithography and etching so as to form the drain electrode 808, the source electrode line 809, and the second signal line layer 810 which have respective different predetermined shapes. The removal by the etching exposes a predetermined region, which will be the channel part 80A, of the gate insulating film 803. It should be noted that the etching on the metal layer 808a may be wet etching or dry etching.

Also in the conventional example, when the metal layer 808a is patterned, the second signal line layer 810 of the organic thin-film transistor 80 as well as the drain electrode 808 and the source electrode line 809 are formed at the same time by the patterning.

Figure 6C:
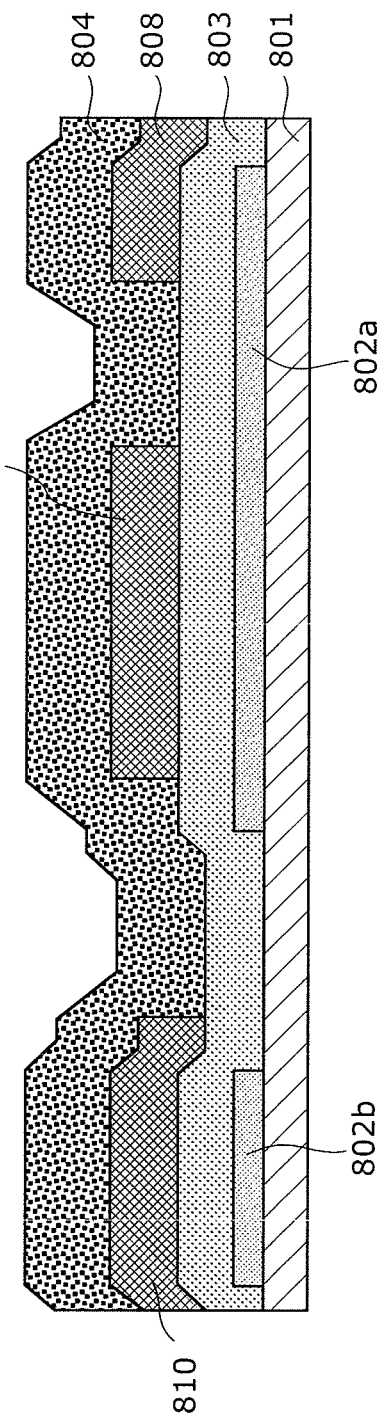
FIG. 6C is a cross-sectional view of one of the steps in the method of manufacturing the conventional organic thin-film transistor.

Next, as shown in FIG. 6C, a material of a predetermined bank layer (bank) is coated on the entire top surface of the substrate 801 to form the bank layer 804. Thereby, the bank layer 804 is formed on the exposed gate insulating film 803, the source electrode, and the source electrode line 809. Here, the bank layer 804 comprises a photosensitive resin and has a thickness of 1 μm.

Figure 6D:
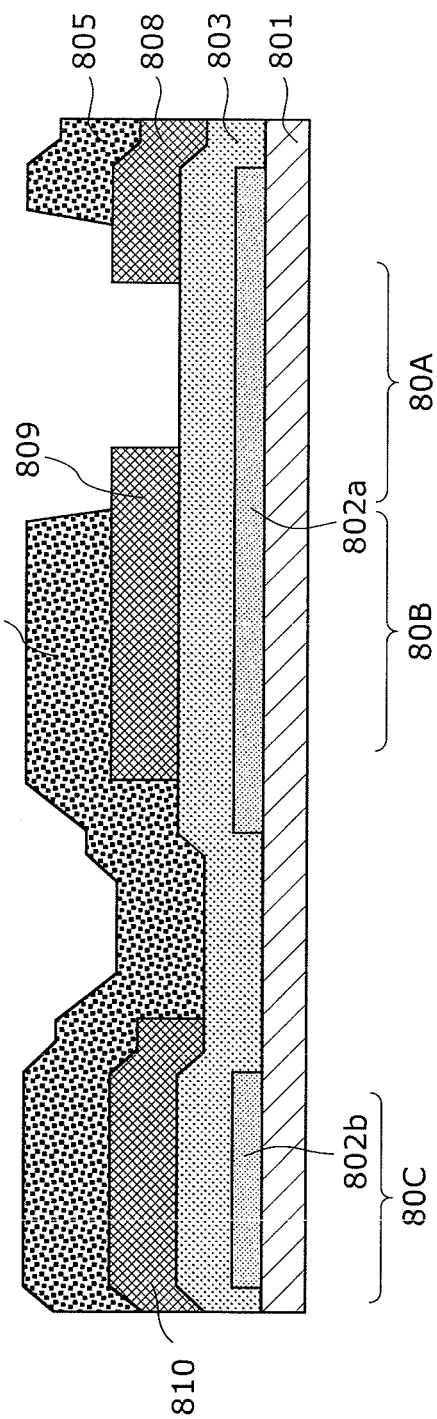
FIG. 6D is a cross-sectional view of one of the steps in the method of manufacturing the conventional organic thin-film transistor.

Next, as shown in FIG. 6D, the bank layer 804 is pattered to re-expose the gate insulating film 803 between the drain electrode 808 and the source electrode line 809 to form an opening in the channel part 80A. As a result, the bank layers 805 and 807 having respective different predetermined shapes are formed. The opening is formed to expose an end of the drain electrode 808 and an end of the source electrode line 809. With this structure, the bank layer 807 is formed on the exposed gate insulating film 803 and the source electrode line 809, and the bank layer 805 is formed on the drain electrode 808.

The patterning on the bank layer 804 may be performed by exposure and development on the bank layer 804. With this structure, the bank layer 807 is formed on the exposed gate insulating film 803 and the source electrode line 809, and the bank layer 805 is formed on the drain electrode 808.

In comparing the method according to the present embodiment to the method of manufacturing the conventional organic thin-film transistor 80, it is seen that the number of steps in the method is not increased.

On the other hand, between the method according to the present embodiment and the method of manufacturing the conventional organic thin-film transistor 80, it is seen that the order of the step of forming the bank layer (the bank layers 105, 106, and 107) and the step of forming the metal layer (the drain electrode 108, the source electrode line 109, and the second signal line layer 110) is different. More specifically, for the organic thin-film transistor 10, the drain electrode 108, the source electrode line 109, and the second signal line layer 110 are formed after forming the bank layers 105, 106, and 107 on the gate insulating film 103. With this, as described above, the thickness of the bank layer 105 causes the unevenness of the drain electrode 108 and the thickness of the bank layer 106 causes the unevenness of the source electrode line 109, so that the drain electrode 108 and the source electrode line 109 can serve as banks for the organic semiconductor layer 111.

As described above, according to the present embodiment, it is possible to provide a thin-film transistor that has improved withstand voltage properties of a gate insulating film and a reduced parasitic capacitance at a part where signal lines cross each other, and a method of manufacturing the thin-film transistor.

Embodiment 2

In Embodiment 1, the bank layer 106 is provided between the storage capacitor part and the channel part. However, the present invention is not limited to the structure. It is also possible not to provide any bank layer between the storage capacitor part and the channel part. This case is described below as Embodiment 2.

Figure 7:
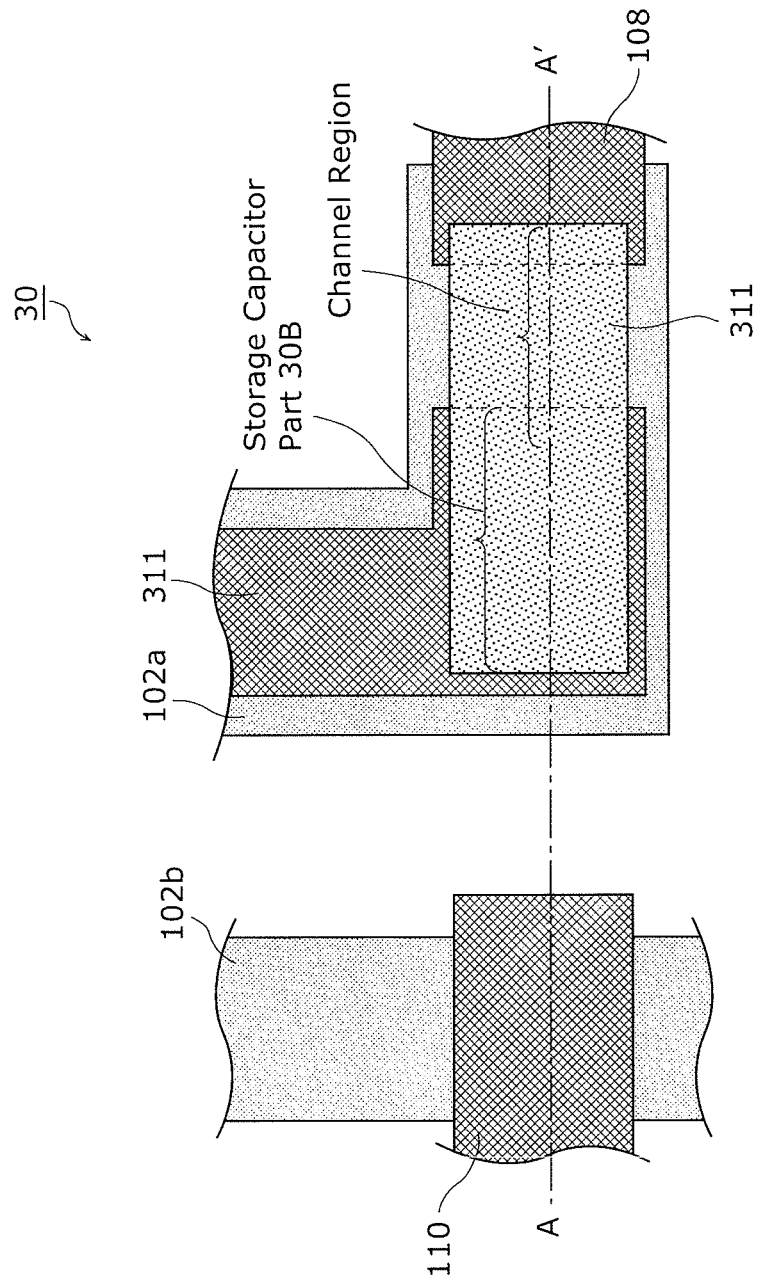
FIG. 7 is a top view of an organic thin-film transistor according to Embodiment 2.
Figure 8:
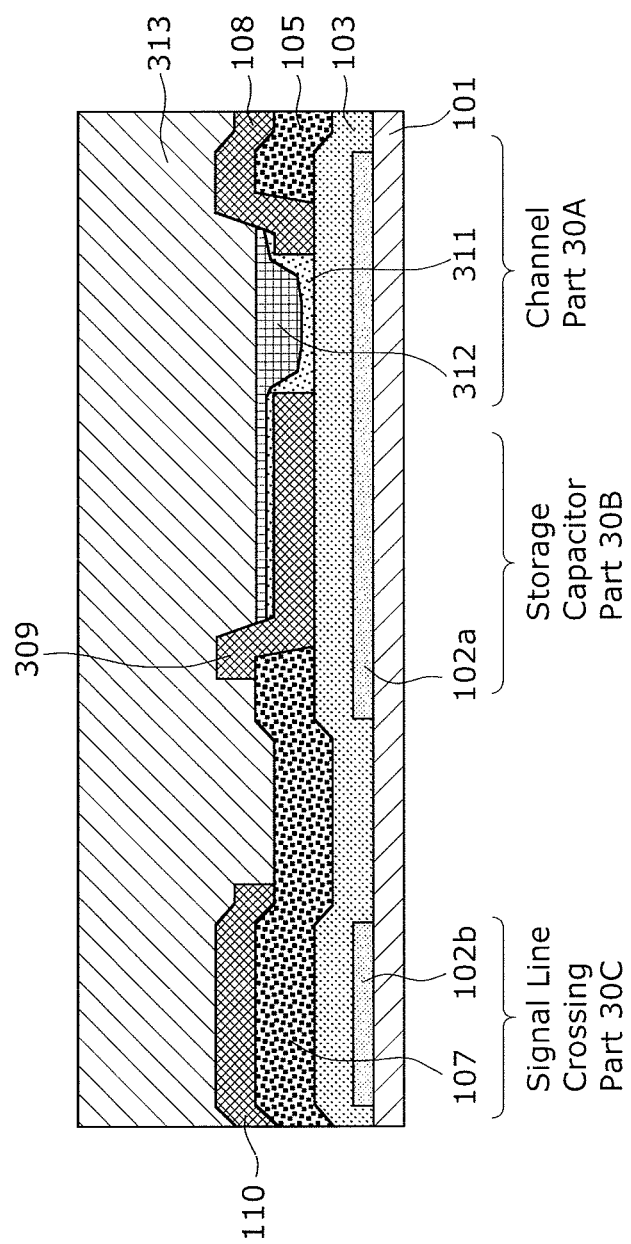
FIG. 8 is a cross-sectional view of the organic thin-film transistor taken along line A-A' of FIG. 7, according to Embodiment 2.

FIG. 7 is a top view of an organic thin-film transistor 30 according to Embodiment 2. FIG. 8 is a cross-sectional view of the organic thin-film transistor 30 according to Embodiment 2 taken along line A-A' in FIG. 7. It should be noted that the same reference numerals in FIGS. 1 and 2 are assigned to the identical structural elements in FIGS. 7 and 8, so that the identical structural elements are not described in detail or described briefly.

The organic thin-film transistor 30 according to Embodiment 2 differs form the organic thin-film transistor 10 according to Embodiment 1 in structures of a source electrode line 309, an organic semiconductor layer 311, and a protection film 312.

More specifically, in Embodiment 2, there is no bank layer between a storage capacitor part 30B and a channel part 30A, so that the organic semiconductor layer 311 is extended to a part in the storage capacitor part 30B.

In other words, the organic semiconductor layer 311 is formed in a region including the gate insulating film 103 in the opening (opening between the banks) so as to be located in the channel part 30A and also the storage capacitor part 30B. Here, the organic semiconductor layer 311 is banked up by the drain electrode 108 and the source electrode line 309.

It should be noted that the structure, such as a material, of the organic semiconductor layer 311 except the above-described aspect is the same as that of the organic semiconductor layer 111, so that the same structure is not described repeatedly.

The protection film 312 is provided to cover the organic semiconductor layer 111. Here, the protection film 312 is banked up by the drain electrode 308 and the source electrode line 309.

The planarizing layer 313 covers the second signal line layer 110, the source electrode line 309, the drain electrode 108, and the protection film 312 to smooth the top surface of the organic thin-film transistor 30.

It should be noted that the structures of the organic semiconductor layer 311, the protection film 312, and the planarizing layer 313 except the above-described aspects are the same as those of the organic semiconductor layer 111, the protection film 112, and the planarizing layer 113, respectively, so that the same structures are not described repeatedly.

Thus, the organic thin-film transistor 30 has the above-described structure.

Figure 9:
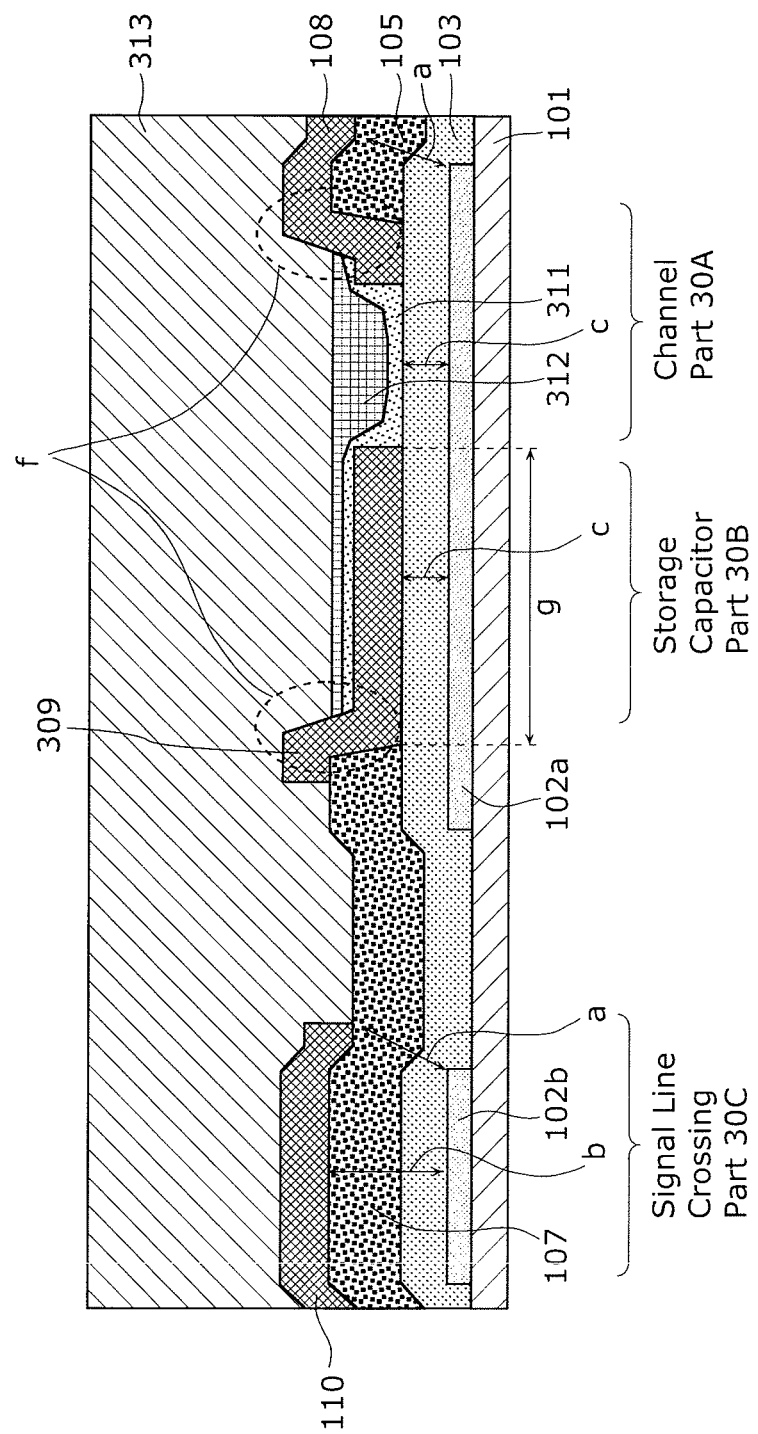
FIG. 9 is a view for explaining effects of the organic thin-film transistor according to Embodiment 2.

Next, the description is given for the effects of the organic thin-film transistor 30 according to Embodiment 2. FIG. 9 is a view for explaining the effects of the organic thin-film transistor 30 according to Embodiment 2. The identical reference numerals in FIG. 8 are assigned to the identical elements in FIG. 9 that are not explained again below.

For the organic thin-film transistor 30, the bank layers 105 and 107 are formed on the gate insulating film 103. After that, the drain electrode 108, the source electrode line 309, and the second signal line layer 110 are formed. As a result, as shown in regions d each surrounded by a broken line in FIG. 9, as effects of the unevenness of each of the bank layers 105 and 107, the drain electrode 108 and the source electrode line 309 as well as the bank layers 105 and 107 serve as banks for the organic semiconductor layer 311.

With the above structure, like the organic thin-film transistor 10 according to Embodiment 1, the organic thin-film transistor 30 can produce four effects described below. The four effects are as follows.

At the beginning, the first effect is explained.

Regarding the organic thin-film transistor 30, in the channel part 30A, there is the bank layer 105 between the drain electrode 108 and the gate insulating film 103. With this structure, the bank layer 105 can cover a part of the gate insulating film 103 which is on the end of the gate electrode line 102a having a low withstand voltage property (low insulating withstand voltage). Furthermore, the bank layer 105 can keep an enough distance a between the gate electrode line 102a and the drain electrode 108. As a result, a leak current can be prevented. In other words, it is possible to improve the withstand voltage property. Likewise, in the signal line crossing part 30C, there is the bank layer 107 between the second signal line layer 110 and the gate insulating film 103. With this structure, the bank layer 107 can cover a part of the gate insulating film 103 which is on the end of the first signal line layer 102b having a low withstand voltage property (low insulating withstand voltage). Furthermore, the bank layer 107 can keep an enough distance a between the first signal line layer 102b and the second signal line layer 110. As a result, a leak current can be prevented. In other words, it is possible to improve the withstand voltage property.

Next, the second effect is explained.

Regarding the organic thin-film transistor 30, in the signal line crossing part 30C, there is the bank layer 107 between the second signal line layer 110 and the gate insulating film 103. With this structure, is it possible to increase a thickness of a layer between the second signal line layer 110 and the first signal line lining part 102b. As a result, a parasitic capacitance is suppressed.

Next, the third effect is explained.

Regarding the organic thin-film transistor 30, in the channel part 30A, the organic semiconductor layer 311 is provided directly on the gate insulating film 103 without providing a bank layer between the organic semiconductor layer 311 and the gate insulating film 103. Also in the storage capacitor part 30B, the source electrode line 309 is provided directly on the gate insulating film 103 without providing a bank layer between the source electrode line 309 and the gate insulating film 103. As a result, the gate insulating film 103 is thin in each of the channel part 30A and the storage capacitor part 30B. In other words, it is possible to ensure electrostatic capacitance of the gate insulating film 103 which is necessary to improve property of the organic thin-film transistor 30.

Finally, the fourth effect is explained.

In the organic thin-film transistor 30, the bank layers 105 and 107 are made of the second dielectric film having a lower permittivity than that of the first dielectric film serving as the gate insulating film 103. With this structure, in the signal line crossing part 30C, it is possible to enhance the second effect of suppressing the parasitic capacitance. Furthermore, in the channel part 30A, it is possible to enhance the third effect of ensuring the electrostatic capacitance of the gate insulating film 103.

In other words, it is possible to decrease the thickness of the gate insulating film 103 in each of the channel part 30A and the storage capacitor part 30B, and increase a thickness of an insulating film in the signal line crossing part 30C by providing a bank layer that is an insulating film (for example, the second permittivity film) different from the gate insulating film 103.

As a result, it is possible not only to improve the property by decreasing the thickness of the gate insulating film 103 in the channel part 30A, but also to increase a storage capacity in the storage capacitor part 30B, and to reduce a signal delay (to increase an operation speed of a pixel circuit) in the signal line crossing part 30C by increasing the thickness of the insulating film and decreasing a permittivity.

Figure 10:
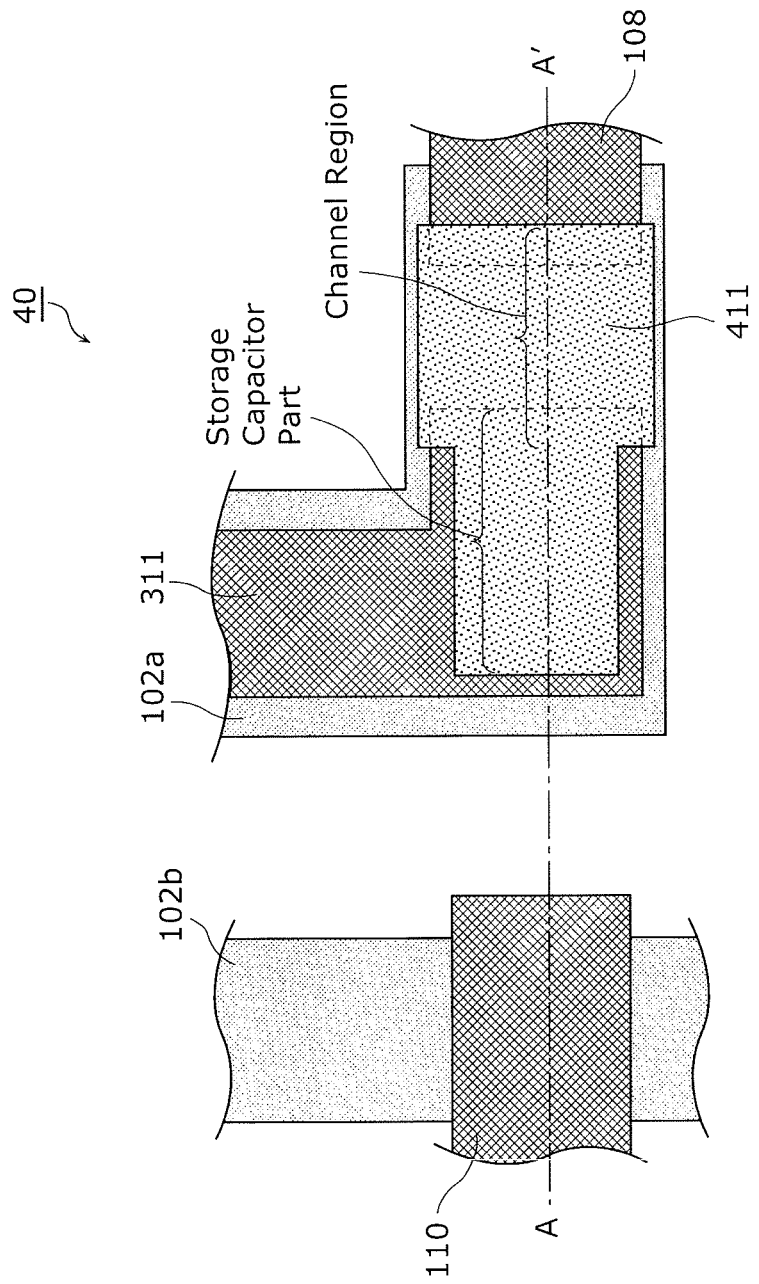
FIG. 10 is a top view of an organic thin-film transistor according to a variation of Embodiment 2.
Figure 11A:
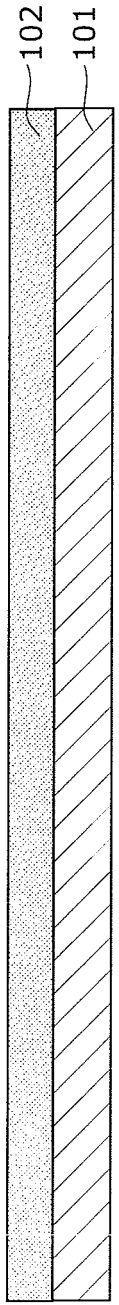
FIG. 11A is a cross-sectional view of one of steps in a method of manufacturing the organic thin-film transistor according to Embodiment 2.
Figure 11B:
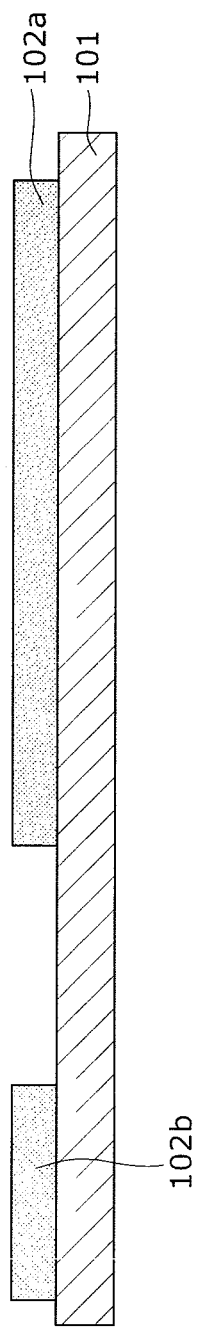
FIG. 11B is a cross-sectional view of one of the steps in the method of manufacturing the organic thin-film transistor according to Embodiment 2.
Figure 11C:
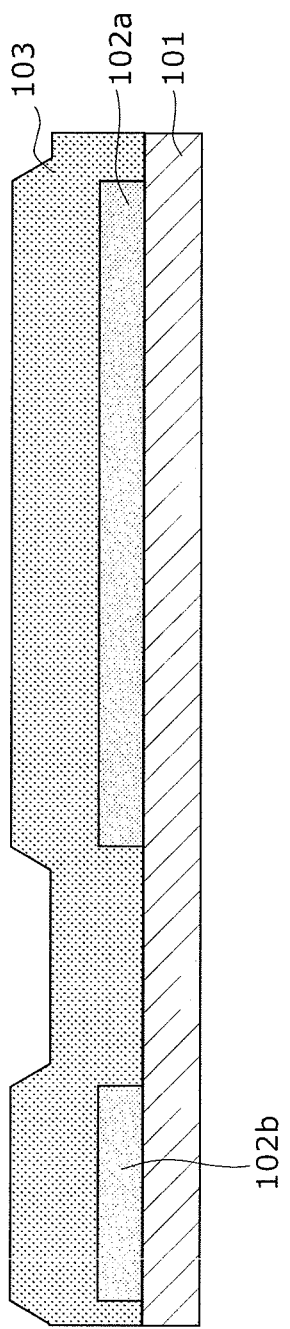
FIG. 11C is a cross-sectional view of one of the steps in the method of manufacturing the organic thin-film transistor according to Embodiment 2.
Figure 12A:
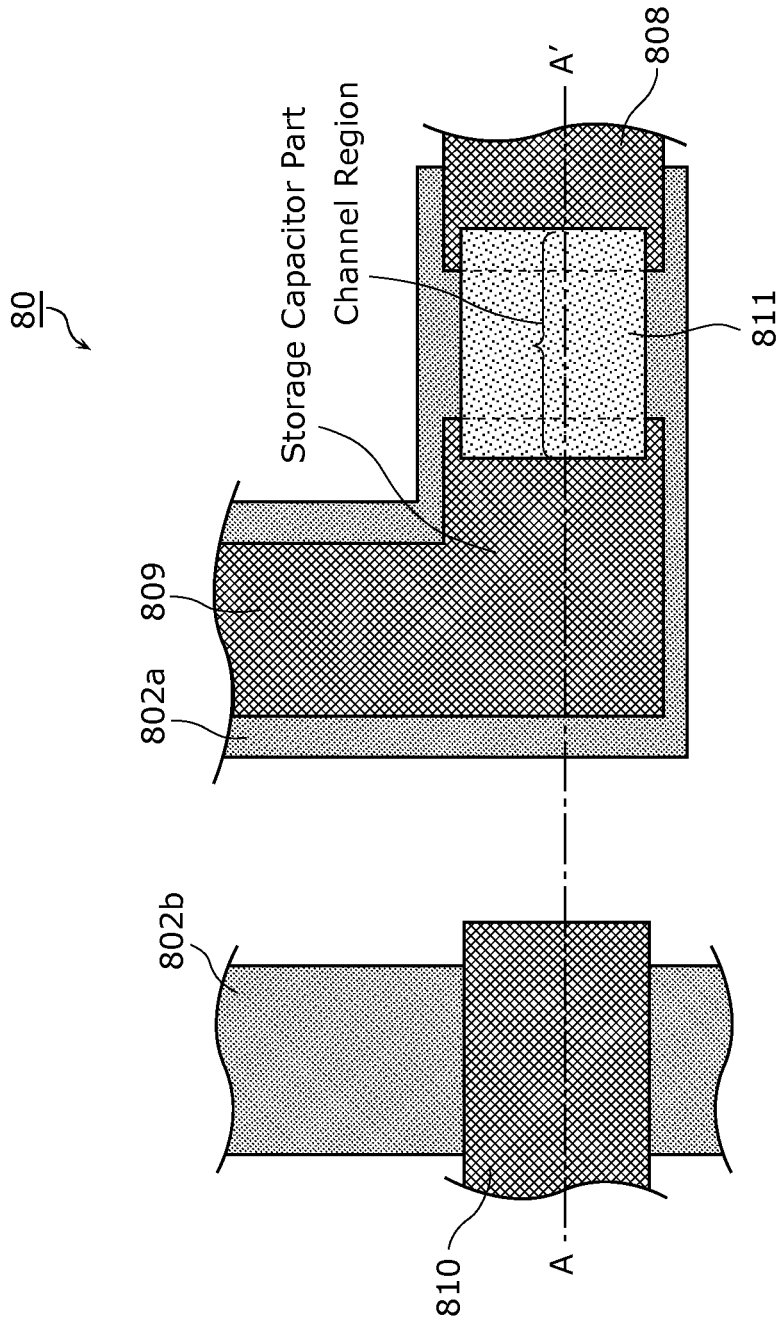
FIG. 12A is a top view of a conventional organic thin-film transistor.
Figure 12B:
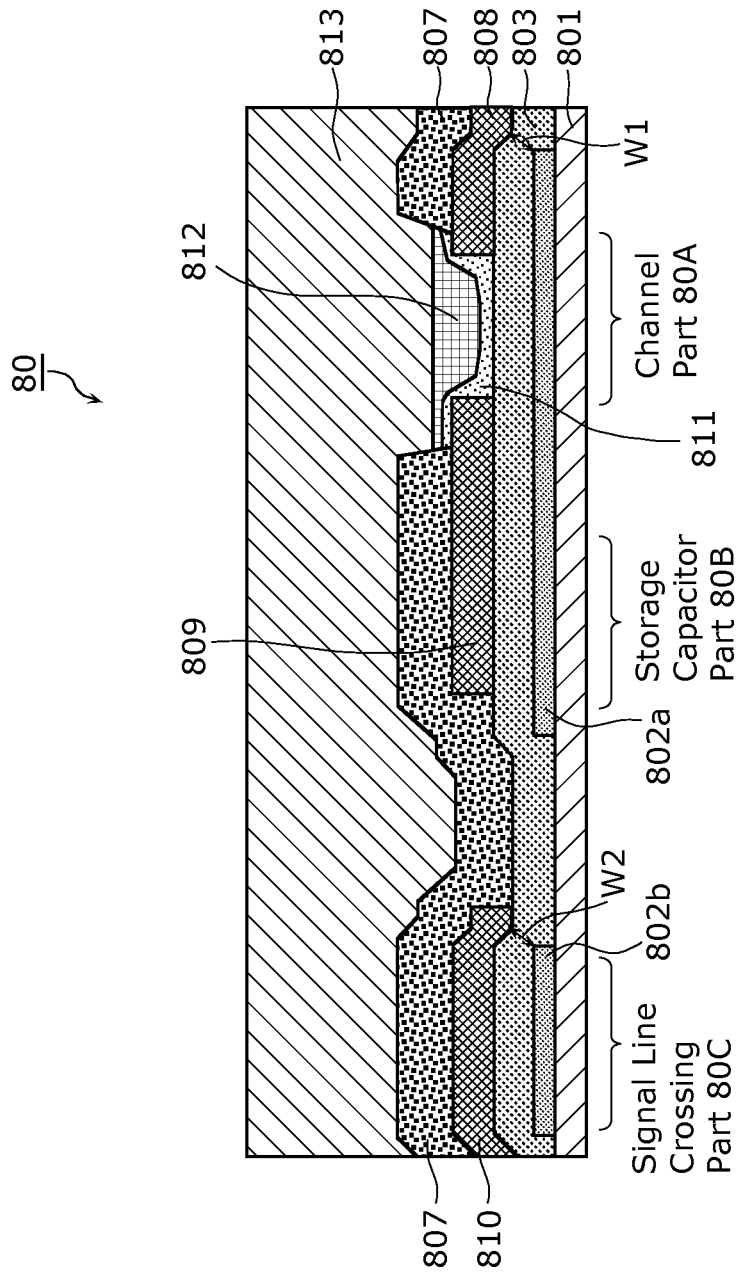
FIG. 12B is a cross-sectional view of the conventional organic thin-film transistor taken along line A-A' of FIG. 12A.

It should be noted that it has been described above that, as shown in FIG. 7, in viewing the organic semiconductor layer 311 from above, the width of the channel region that is a region of the organic semiconductor layer 311 is shorter than the width of each of the drain electrode 108 and the source electrode line 309. However, the structure is not limited to the above. For example, as shown in FIG. 10, it is also possible that the width of the channel region is longer than the width of each of the drain electrode 108 and the source electrode line 309 viewed from above. Here, FIG. 10 is a top view of an organic thin-film transistor 40 according to a variation of Embodiment 2.

Next, a method of manufacturing the organic thin-film transistor 30 according to Embodiment 2 is described with reference to FIGS. 11A to 11J. FIGS. 11A to 11J are cross-sectional views for explaining respective steps in the method of manufacturing the organic thin-film transistor 30 according to Embodiment 2. The identical reference numerals in FIGS. 5A to 5J and 8 are assigned to the identical elements in FIGS. 11A to 11J that are not explained again below.

The steps of FIGS. 11A to 11D are the same as FIGS. 5A to 5D, so that the steps are not described again below.

Next, as shown in FIG. 11E, the bank layer 104 is patterned to expose the gate insulating film 103, so as to form openings at predetermined regions, which will be the channel part 10A and the storage capacitor part 10B, over the gate electrode line 102a. As a result, the bank layers 105 and 107 having respective different predetermined shapes are formed.

Here, the bank layers 105 and 107 are formed by patterning the bank layer 104 by photolithography and etching. The predetermined region of the bank layer 104 is removed by etching to expose the gate insulating film 103. It should be noted that the etching on the bank layer 104 may be wet etching or dry etching. It should also be noted that, if the bank layer 104 is made of the second dielectric film comprising an organic insulating film, the patterning may be performed by exposure and development on the bank layer 104.

If the bank layer 104 is made of the second dielectric film comprising the above-described material added with F, it is possible to reduce the permittivity of the bank layer 104.

Next, as shown in FIG. 11F, a material of the drain electrode 108, the source electrode line 309, and the second signal line layer 110 is deposited on the bank layers 105 and 107 and the gate insulating film 103, thereby forming a metal layer 308a. The metal layer 308a is formed by spattering or vapor deposition as a single-layer or multi-layer film or a metal alloy film comprising Mo, W, Cu, Al, Au, Ag, MoW, MoN, and/or the like. In the present embodiment, a single-layer film comprising MoW is formed as the metal layer 308a.

Next, as shown in FIG. 11G, the metal layer 308a is patterned by photolithography and etching so as to form the drain electrode 108, the source electrode line 309, and the second signal line layer 110 which have respective different predetermined shapes. The removal by the etching exposes a predetermined region, which will be the channel part 10A, of the gate insulating film 103. It should be noted that the etching on the metal layer 308a may be wet etching or dry etching.

It is thereby possible to form the second signal line layer on the bank layer 107 over the first signal line layer 102b. It is also possible to form the source electrode line 309 (a) on the end of the bank layer 107 close to the storage capacitor part 30B and (b) in the opening between the bank layer 107 and the bank layer 105 in the storage capacitor part 30B. It is further possible to form the drain electrode 108 (a) in a part closer to the bank layer 105 in the opening between the bank layer 107 and the bank layer 105 and (b) and on the bank layer 105.

In the present embodiment, when the metal layer 308a is patterned, the second signal line layer 110 of the organic thin-film transistor 30 as well as the drain electrode 108 and the source electrode line 309 are formed at the same time by the patterning. In other words, the second signal line layer 110 in the signal line crossing part 30C of the organic thin-film transistor 30 is formed together with the drain electrode 108 and the source electrode line 309 at the same time to comprise the same material.

For example, it is possible to form a plurality of signal lines including the second signal line layer 110 by patterning the metal layer 308a. It is also possible to form the drain electrode 108 as one of the signal lines.

Next, as shown in FIG. 11H, a solution including an organic semiconductor material (organic semiconductor solution) is applied by an ink-jet method in the opening between the bank layer 107 and the bank layer 105, in other words, on (a) the gate insulating film 103 between the source electrode line 309 and the source electrode line 309 and (b) the drain electrode in the storage capacitor part 30B. Here, the coating solution including the organic semiconductor material is spread on the exposed top surface of the gate insulating film 103, and also spread on the side surfaces and the top surfaces of the uneven parts of the drain electrode 108 and the source electrode line 309 in the opening between the bank layer 107 and the bank layer 105. The coating region of the solution including the organic semiconductor material is defined by being banked up by the drain electrode 108 and the source electrode line 309 having the unevenness caused by the bank layer 105 and the bank layer 107, respectively. It is thereby possible to prevent that the solution including the organic semiconductor material from leaking to the outside of the opening between the bank layer 107 and the bank layer 105.

After that, a predetermined heat treatment is performed to dry the solution including the organic semiconductor material to crystallize the organic semiconductor material. Thereby, it is possible to form the organic semiconductor layer 311 having outer circumference defined by the drain electrode 108 and the source electrode line 109 in the opening between the bank layer 107 and the bank layer 305.

It should be noted that, in coating of the organic semiconductor material solution by the ink-jet method, it is preferable to put drops of the solution onto the center area of the opening between the bank layer 107 and the bank layer 105. With this structure, the solution including the organic semiconductor material is homogeneously spread in the region surrounded by the drain electrode 108 and the source electrode line 309 in the opening between the bank layer 107 and the bank layer 105. As a result, it is possible to form the organic semiconductor layer 311 having more uniform thickness throughout. The organic semiconductor material may be pentacene, phthalocyanine, or porphyrin soluble organic material. It should be noted that the above-described predetermined heat treatment is preferably performed at a temperature allowing the organic semiconductor material in the solution to be crystallized without being decomposed by the heat, and allowing the solvent of the solution to evaporate. In the present embodiment, the heat treatment is performed at approximately 200 C.°.

Next, as shown in FIG. 11I, a solution including an overcoat material, which is a material of the protection film 312, is applied by an ink-jet method onto the organic semiconductor layer 311 to coat the region surrounded by the drain electrode 108 and the source electrode line 309 in the opening between the bank layer 107 and the bank layer 105. Here, the coating region of the solution including the overcoat material is defined by being banked up by the drain electrode 108 and the source electrode line 309 having the unevenness caused by the bank layer 105 and the bank layer 107, respectively. As a result, it is possible to prevent the solution including the overcoat material from leaking to the outside of the opening between the bank layer 105 and the bank layer 107. After coating the predetermined region by the solution including the overcoat material, a predetermined heat treatment is performed. Thereby, the solution including the overcoat material is dried to form the protection film 312 having defined outer circumference.

Here, if the overcoat material in the solution includes a cross-linked material caused by heat, the heat treatment can improve the protection function of the protection film 312. Furthermore, if the overcoat material includes a cross-linked material caused by light, irradiation of light such as ultra violet rays causes molecular bonds among molecules of the overcoat material, and the molecular structure is densified to fortify the polymer bonds. It is thereby possible to enhance the effects of the protection film 112 to block oxygen, water, or impurity.

It should be noted that it has been described in the present embodiment that the overcoat material is applied by the ink-jet method, but it is also possible to apply the overcoat material to the entire surface by spin coating to produce the same effects as long as a necessary thickness is obtained on the organic semiconductor.

Next, as shown in FIG. 11J, the planarizing layer 313 is formed to cover the second signal line layer 110, the source electrode line 309, the drain electrode 108, and the protection film 312. The planarizing layer 313 has a desired thickness to have a planar surface. It should be noted that the planarizing layer 313 may be formed by coating with a predetermined material such as SOG.

As described above, the organic thin-film transistor 30 according to the present embodiment can be manufactured.

Thus, according to the present invention, it is possible to provide: a thin-film transistor that has improved withstand voltage properties of a gate insulating film and a reduced parasitic capacitance at a part where signal lines cross each other; and a method of manufacturing the thin-film transistor.

Although the organic thin-film transistor according to the present invention and the method of manufacturing the organic thin-film transistor have been described with reference to the embodiments above, the present invention is not limited to the embodiments.

The organic thin-film transistor according to the present invention is typically applicable in organic EL display devices having organic EL elements, but may be applied in other display devices having active-matrix substrates, such as liquid crystal display elements. The display devices having the above structure can be used as flat panel display devices, and are applicable to electric devices, such as television sets, personal computers, and mobile telephones, which have various display panels.

Those skilled in the art will be readily appreciated that various modifications of the exemplary embodiments and combinations of the structural elements of the different embodiments are possible without materially departing from the novel teachings and advantages of the present invention. Accordingly, all such modifications and combinations are intended to be included within the scope of the present invention.

INDUSTRIAL APPLICABILITY

The organic thin-film transistor according to the present invention can be widely used in display devices and other various electric devices, such as television sets, personal computers, and mobile telephones.

REFERENCE SIGNS LIST 10, 20, 30, 40, 80 organic thin-film transistor
10A, 30A, 80A channel part
10B, 30B, 80B storage capacitor part
10C, 30C, 80C signal line crossing part
101, 801 substrate
102a, 802a gate electrode line
102b, 802b first signal line layer
102, 108a, 308a, 808a metal layer
103, 803 gate insulating film
104, 105, 106, 107, 804, 805, 807 bank layer
108, 808 drain electrode
109, 309, 809 source electrode line
110, 810 second signal line layer
111, 311, 811 organic semiconductor layer
112, 312, 812 protection film
113, 313, 813 planarizing layer

The invention claimed is:

1. A thin-film transistor comprising:
a gate electrode line on a substrate in a first region;
a first signal line layer on the substrate in a second region that is different from the first region;
a gate insulating film above the substrate, the gate insulating film covering the gate electrode line and the first signal line layer, and the gate insulating film being made of a first dielectric film;
bank layers on the gate insulating film, the bank layers each being made of a second dielectric film having a lower permittivity than a permittivity of the first dielectric film;
a second signal line layer on one of the bank layers over the first signal line layer;
a pair of a drain electrode and a source electrode line which are located on the bank layers which are at least in the first region, and in at least two openings between the bank layers in the first region;
a semiconductor layer located at least on the gate insulating film in one of the at least two openings, and banked up by two of the bank layers which are at least in the first region, the drain electrode, and the source electrode line; and
a protection film covering the semiconductor layer and banked up by the two of the bank layers, the drain electrode, and the source electrode line,
wherein the at least two openings are between the bank layers in a third region and a fourth region which are included in the first region to expose a part of the gate insulating film,
the at least two openings include a first opening in the third region and a second opening in the fourth region,
the bank layers which are at least in the first region include a first bank layer at a location including a border between the third region and the fourth region and a second bank layer facing the first bank layer via the semiconductor layer,
the source electrode line is located on the gate insulating film in the first opening, on the first bank layer, and on a part of the gate insulating film in the second opening, the part of the gate insulating film being closer to the third region than another part of the gate insulating in the second opening,
the drain electrode is located on the another part of the gate insulating film in the second opening, and on the second bank layer, the another part of the gate insulating film being closer to the second bank layer than the part of the gate insulating film,
the semiconductor layer is located on the gate insulating film in the second opening, and banked up by at least the drain electrode and the source electrode line, and
the protection film covers the semiconductor layer and is banked up by at least the drain electrode and the source electrode line.

2. The thin-film transistor according to claim 1, wherein
the part of the gate insulating film the is adjacent to the first bank layer, the first bank layer being closer to the second region than the second bank layer,
the another part of the gate insulating film is adjacent to the second bank layer,
the semiconductor layer is banked up by the first bank layer, the second bank layer, the drain electrode, and the source electrode line, and
the protection film is banked up by the first bank layer, the second bank layer, the drain electrode, and the source electrode line.

3. The thin-film transistor according to claim 1, wherein the third region is a storage capacitor part that includes a part of the gate electrode line, a part of the gate insulating film, and at least a part of the source electrode line, and the fourth region is a channel part that includes a part of the gate electrode line, a part of the gate insulating film, the semiconductor layer, a part of the drain electrode, and a part of the source electrode line.

4. The thin-film transistor according to claim 1, wherein the thin-film transistor has:
a storage capacitor part that includes a part of the gate electrode line, a part of the gate insulating film, and at least a part of the source electrode line; and
a channel part that includes a part of the gate electrode line, a part of the gate insulating film, the semiconductor layer, a part of the drain electrode, and a part of the source electrode line.

5. The thin-film transistor according to claim 1 further comprising
a planarizing layer covering the second signal line layer, the source electrode line, the drain electrode, and the protection film.

6. The thin-film transistor according to claim 1, wherein the drain electrode, the source electrode, and the second signal line layer are made of a same material.

7. The thin-film transistor according to claim 1, wherein a side surface of at least one opening of the at least two openings has a forward tapered shape.

8. The thin-film transistor according to claim 1, wherein the semiconductor layer comprises a coating organic semiconductor.

9. The thin-film transistor according to claim 1, wherein the semiconductor layer comprises a coating oxide semiconductor.

10. A method of manufacturing a thin-film transistor, comprising:
forming a gate electrode line on a substrate in a first region,
forming a first signal line layer above the substrate in a second region that is different from the first region;
forming a gate insulating film above the substrate, the gate insulating film covering the gate electrode line and the first signal line layer, and the gate insulating film being made of a first dielectric film;
forming bank layers on the gate insulating film, the bank layers each being made of a second dielectric film having a lower permittivity than a permittivity of the first dielectric film;
forming a second signal line layer on one of the bank layers over the first signal line layer;
forming a drain electrode and a source electrode line on the bank layers which are at least in the first region, and in at least two openings between the bank layers in the first region;
forming a semiconductor layer at least on the gate insulating film in one of the at least two openings, the semiconductor layer being banked up by two of the bank layers which are at least in the first region, the drain electrode, and the source electrode line; and
forming a protection film to cover the semiconductor layer, the protection film being banked up by the two of the bank layers, the drain electrode, and the source electrode line,
wherein the at least two openings are between the bank layers in a third region and a fourth region which are included in the first region to expose a part of the gate insulating film,
the at least two openings include a first opening in the third region and a second opening in the fourth region,
the bank layers which are at least in the first region include a first bank layer at a location including a border between the third region and the fourth region and a second bank layer facing the first bank layer via the semiconductor layer,
the source electrode line is located on the gate insulating film in the first opening, on the first bank layer, and on a part of the gate insulating film in the second opening, the part of the gate insulating film being closer to the third region than another part of the gate insulating in the second opening,
the drain electrode is located on the another part of the gate insulating film in the second opening, and on the second bank layer, the another part of the gate insulating film being closer to the second bank layer than the part of the gate insulating film,
the semiconductor layer is located on the gate insulating film in the second opening, and banked up by at least the drain electrode and the source electrode line, and
the protection film covers the semiconductor layer and is banked up by at least the drain electrode and the source electrode line.

11. A thin-film transistor, comprising:
a gate electrode line on a substrate;
a gate insulating film on the gate electrode line, the gate insulating film being made of a first dielectric film;
bank layers on the gate insulating film, the bank layers each being made of a second dielectric film having a permittivity different from a permittivity of the first dielectric film;
at least two openings between two of the bank layers which are at least in a region that includes a channel part and a storage capacitor part;
a line layer on one of the bank layers in a region that is different from the channel part and the storage capacitor part; and
a drain electrode and a source electrode line which are located on the gate insulating film in the at least two openings in the region that includes the channel part and the storage capacitor part,
wherein the channel part includes a semiconductor layer located in one of the at least two openings, and a protection film covering the semiconductor layer, and
the semiconductor layer has a circumference defined by the two of the bank layers, the drain electrode, and the source electrode line in the one of the at least two openings in the channel part,
wherein the at least two openings are between bank layers in the region that includes the channel part and the storage capacitor part to expose a part of the gate insulating film,
the at least two openings include a first opening in the storage capacitor part and a second opening in the channel part,
the bank layers which are at least in the first region include a first bank layer at a location including a border between the storage capacitor part and the channel part and a second bank layer facing the first bank layer via the semiconductor layer,
the source electrode line is located on the gate insulating film in the first opening, on the first bank layer, and on a part of the gate insulating film in the second opening, the part of the gate insulating film being closer to the storage capacitor part than another part of the gate insulating film in the second opening,
the drain electrode is located on the another part of the gate insulating film in the second opening, and on the second bank layer, the another part of the gate insulating film being closer to the second bank layer than the part of the gate insulating film, the semiconductor layer is located on the gate insulating film in the second opening, and banked up by at least the drain electrode and the source electrode line, and the protection film covers the semiconductor layer and is banked up by at least the drain electrode and the source electrode line.

* * * * *